United States Patent
Linderman

(10) Patent No.: US 8,796,535 B2
(45) Date of Patent: Aug. 5, 2014

(54) THERMAL TRACKING FOR SOLAR SYSTEMS

(75) Inventor: Ryan J. Linderman, Oakland, CA (US)

(73) Assignee: Sunpower Corporation, San Jose, CA (US)

(*) Notice: Subject to any disclaimer, the term of this patent is extended or adjusted under 35 U.S.C. 154(b) by 222 days.

(21) Appl. No.: 13/250,825

(22) Filed: Sep. 30, 2011

(65) Prior Publication Data

US 2013/0081668 A1    Apr. 4, 2013

(51) Int. Cl.
*H01L 31/042* (2014.01)
*H02N 6/00* (2006.01)

(52) U.S. Cl.
USPC .......................................................... 136/246

(58) Field of Classification Search
USPC .......................................................... 136/246
See application file for complete search history.

(56) References Cited

U.S. PATENT DOCUMENTS

| | | | |
|---|---|---|---|
| 4,102,196 A * | 7/1978 | Holtermann | 136/214 |
| 4,153,474 A | 5/1979 | Rex | |
| 4,187,834 A * | 2/1980 | Hoinski | 126/574 |
| 4,323,719 A | 4/1982 | Green | |
| 4,373,783 A | 2/1983 | Anderson | |
| 4,456,332 A | 6/1984 | Anderson | |
| 4,468,848 A | 9/1984 | Anderson et al. | |
| 4,468,849 A | 9/1984 | Anderson et al. | |
| 4,481,378 A | 11/1984 | Lesk | |
| 4,502,200 A | 3/1985 | Anderson et al. | |
| 4,640,734 A | 2/1987 | Roberts et al. | |
| 4,643,543 A | 2/1987 | Mohn et al. | |
| 4,643,544 A | 2/1987 | Loughran | |
| 4,759,803 A | 7/1988 | Cohen | |
| 5,180,441 A | 1/1993 | Cornwall et al. | |
| 5,248,346 A | 9/1993 | Fraas et al. | |
| 5,334,496 A | 8/1994 | Pond et al. | |
| 5,344,496 A | 9/1994 | Stern et al. | |
| 5,389,158 A | 2/1995 | Fraas et al. | |
| 5,409,549 A | 4/1995 | Mori | |
| 5,498,297 A | 3/1996 | O'Neill et al. | |
| 5,580,395 A | 12/1996 | Yoshioka et al. | |
| 5,616,185 A | 4/1997 | Kukulka | |
| 5,660,644 A | 8/1997 | Clemens | |
| 5,697,192 A | 12/1997 | Inoue | |

(Continued)

FOREIGN PATENT DOCUMENTS

| DE | 10041271 | 3/2002 |
|---|---|---|
| DE | 202004005198 | 8/2004 |

(Continued)

OTHER PUBLICATIONS

Bardwell, Karen et al., "Minimizing End Shadowing Effects on Parabolic Concentrator Arrays," IEEE, 1980, pp. 765-770.

(Continued)

*Primary Examiner* — Eli Mekhlin
(74) *Attorney, Agent, or Firm* — Knobbe, Martens, Olson & Bear LLP

(57) ABSTRACT

A thermal tracking system for a concentrating photovoltaic system is disclosed. The thermal tracking system comprises a photovoltaic receiver. The photovoltaic receiver comprises a photovoltaic laminate and a heat spreader. The thermal tracking system further comprises first and second thermal sensors coupled to the photovoltaic laminate and sensing two temperatures of the laminate. The thermal tracking system also comprises third and fourth thermal sensors positioned adjacent the heat spreader and sensing two temperatures near the heat spreader.

25 Claims, 13 Drawing Sheets

(56) References Cited

U.S. PATENT DOCUMENTS

| | | |
|---|---|---|
| 5,865,905 A | 2/1999 | Clemens |
| 5,899,199 A | 5/1999 | Mills |
| 5,990,415 A | 11/1999 | Green et al. |
| 6,034,322 A | 3/2000 | Pollard |
| 6,131,565 A | 10/2000 | Mills |
| 6,323,478 B1 | 11/2001 | Fujisaki et al. |
| 6,359,209 B1 | 3/2002 | Glenn et al. |
| 6,442,937 B1 | 9/2002 | Stone et al. |
| 6,553,729 B1 | 4/2003 | Nath et al. |
| 6,635,507 B1 | 10/2003 | Boutros et al. |
| 7,109,461 B2 * | 9/2006 | Lasich ............... 250/203.4 |
| 7,468,485 B1 | 12/2008 | Swanson |
| 7,554,031 B2 * | 6/2009 | Swanson et al. ........... 136/261 |
| 7,709,730 B2 | 5/2010 | Johnson et al. |
| 7,820,906 B2 | 10/2010 | Johnson et al. |
| 7,825,327 B2 | 11/2010 | Johnson et al. |
| 7,932,461 B2 | 4/2011 | Johnson et al. |
| 7,952,057 B2 | 5/2011 | Finot et al. |
| 7,968,791 B2 | 6/2011 | Do et al. |
| 8,039,777 B2 | 10/2011 | Lance et al. |
| 8,049,150 B2 | 11/2011 | Johnson et al. |
| 8,071,930 B2 | 12/2011 | Wylie et al. |
| 8,083,362 B2 | 12/2011 | Finot et al. |
| 2004/0074490 A1 | 4/2004 | Mills et al. |
| 2007/0151598 A1 | 7/2007 | De Ceuster et al. |
| 2007/0203416 A1 * | 8/2007 | Lowe .................. 600/485 |
| 2007/0251569 A1 | 11/2007 | Shan et al. |
| 2007/0257274 A1 | 11/2007 | Martter et al. |
| 2008/0035198 A1 | 2/2008 | Teppe et al. |
| 2009/0056699 A1 | 3/2009 | Mills et al. |
| 2009/0056785 A1 | 3/2009 | Johnson et al. |
| 2009/0056786 A1 | 3/2009 | Johnson et al. |
| 2009/0056787 A1 | 3/2009 | Johnson et al. |
| 2009/0095284 A1 | 4/2009 | Klotz |
| 2009/0139557 A1 | 6/2009 | Rose et al. |
| 2009/0145480 A1 | 6/2009 | Adest et al. |
| 2009/0188487 A1 | 7/2009 | Jones et al. |
| 2010/0154788 A1 | 6/2010 | Wells et al. |
| 2010/0163014 A1 | 7/2010 | Johnson et al. |
| 2010/0175740 A1 | 7/2010 | Johnson et al. |
| 2010/0193014 A1 | 8/2010 | Johnson et al. |
| 2010/0236626 A1 | 9/2010 | Finot et al. |
| 2010/0294336 A1 | 11/2010 | Johnson et al. |
| 2010/0319682 A1 | 12/2010 | Klotz |
| 2011/0023940 A1 | 2/2011 | Do et al. |
| 2011/0132457 A1 | 6/2011 | Finot |
| 2011/0186130 A1 | 8/2011 | Finot et al. |
| 2011/0226309 A1 | 9/2011 | Do et al. |
| 2011/0226310 A1 | 9/2011 | Johnson et al. |
| 2011/0265869 A1 | 11/2011 | Finot et al. |

FOREIGN PATENT DOCUMENTS

| | | |
|---|---|---|
| GB | 2340993 | 3/2000 |
| JP | 2007184542 | 7/2007 |
| JP | 2007194521 | 8/2007 |
| JP | 2007214247 | 8/2007 |
| KR | 1020070070183 | 7/2007 |
| KR | 1020090014153 | 2/2009 |
| KR | 10-0902882 | 6/2009 |
| WO | WO9957493 | 11/1999 |
| WO | WO2007096157 | 8/2007 |
| WO | WO2007096158 | 8/2007 |
| WO | WO2008022409 | 2/2008 |
| WO | WO2008153922 | 12/2008 |
| WO | WO2009023063 | 2/2009 |
| WO | WO2009029275 | 3/2009 |
| WO | WO2009029277 | 3/2009 |

OTHER PUBLICATIONS

Carroll, Don et al. "Production of the Alpha Solarco Proof-of-Concept Array," IEEE, 1990, pp. 1136-1141.

Edenburn, Michael W., et al. "Shading Analysis of a Photovoltaic Cell String Illuminated by a Parabolic Trough Concentrator," IEEE, 1981, pp. 63-68.

Quagan, Robert J., "Laser Diode Heat Spreaders," Ion Beam Milling, Inc., website copyright 2010, http://www.ionbeammilling.com/default.asp, 9 pgs.

Shepard, Jr., N. F. et al., "The Integration of Bypass Diodes with Terrestrial Photovoltaic Modules and Arrays," IEEE, 1984, pp. 676-681.

Stern, T. G., "Interim results of the SLATS concentrator experiment on LIPS-II (space vehicle power plants)," Photovoltaic Specialists Conference, 1988., Conference Record of the Twentieth IEEE , vol., No., pp. 837-840 vol. 2, 1988. URL: http://ieeexplore.ieee.org/stamp/stamp.jsp?tp=&arnumber=105822&isnumber=3239.

Vivar Garcia, Marta, "Optimisation of the Euclides Photovoltaic Concentrator," 2009, 390 pages.

International Search Report and Written Opinion received in International Patent Application No. PCT/US2012/057770, dated Jan. 17, 2013, filed on Sep. 28, 2012.

* cited by examiner

THERMAL TRACKING FOR SOLAR SYSTEMS

TECHNICAL FIELD

Embodiments of the subject matter described herein relate generally to sensing and feedback systems. More particularly, embodiments of the subject matter relate to tracking systems for solar panels.

BACKGROUND

Solar systems which track apparent movement of the sun across the sky during the day typically use sensors to determine the position of the sun and adjust the solar system accordingly. A variety of techniques are currently used to operate solar systems. For example, sun position tables generated from known longitude and latitude can be used to predict the location of the sun during the course of the day. The deviation between predicted and actual position can be significant. Some sources of alignment error can be caused, for example, by inaccurate site location, contributions from an inclinometer, motor encoder, or other positioning equipment error. Although seemingly small, a single degree of alignment error can translate into an efficiency decrease of over 10%, particularly when aligning a solar concentrating system. Moreover, for solar concentrating systems, reduced alignment error permits accurate placement of concentrated sunlight. When concentrated sunlight can be directed more accurately, the associated solar cell and receiver can be of a smaller size than one which needs to be larger to allow for misaligned concentrated sunlight. The reduced size of the solar cell and receiver allows for cost savings in material and fabrication.

As an alternative to such dead reckoning techniques, feedback-based tracking systems are sometimes used. Such feedback systems can include cameras, which interpret visual imagery to locate the sun's position and align the solar system accordingly. Cameras are, however, typically expensive, and can require extensive and sophisticated signal processing to determine a precise solar position. Additionally, the camera element will encounter environmental effects which can decrease its efficacy as a sensor. Moreover, imprecision in mounting the camera also can result in alignment error.

Another feedback-based approach operates by inspecting the power generated by the system to determine the optimal alignment. Such power feedback systems typically intentionally introduce a small deviation to the system for the purpose of determining the peak power output based on alignment of the solar system. High speed electronics, which can be expensive, are required to perform the rapid inspection needed to determine the optimum alignment profile. Additionally, small changes in irradiance due to clouds or air masses can produce a condition similar to a misalignment condition, thereby confusing the tracker. Consequently, the tracker can introduce erroneous misalignment, thereby reducing efficiency.

Current tracking systems, therefore, can be expensive, introduce misalignment error even under optimal conditions, and can have sensitive components exposed to detrimental environmental conditions. Notwithstanding the difficulties in cheaply and accurately positioning a solar system, it is desirable to perform such tracking to increase the efficiency of the system.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
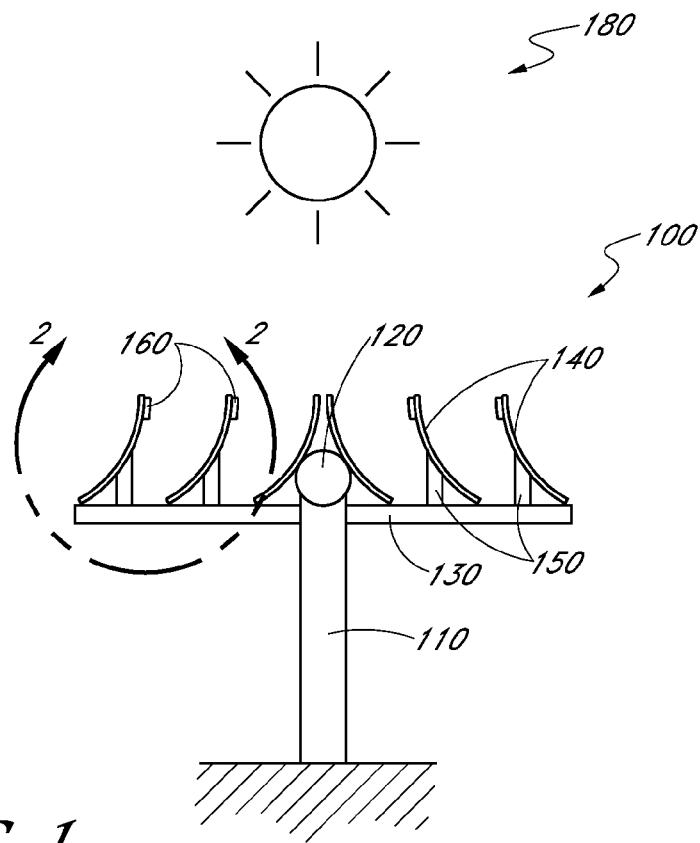
FIG. 1 is a side view of a solar system in an operational state.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Techniques and technologies may be described herein in terms of functional and/or logical block components and with reference to symbolic representations of operations, processing tasks, and functions that may be performed by various computing components or devices. In practice, one or more processor devices can carry out the described operations, tasks, and functions by manipulating electrical signals representing data bits at memory locations in the system memory, as well as other processing of signals. For example, an embodiment of a system or a component, such as a controller or control system, may employ various integrated circuit components, e.g., memory elements, digital signal processing elements, logic elements, look-up tables, or the like, which may carry out a variety of functions under the control of one or more microprocessors or other control devices.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically. Thus, although the schematic shown in FIG. 10, which is selected solely as an example, depicts one exemplary arrangement of elements, additional intervening elements, devices, features, or components may be present in an embodiment of the depicted subject matter.

"Adjust"—Some elements, components, and/or features are described as being adjustable or adjusted. As used herein, unless expressly stated otherwise, "adjust" means to position, modify, alter, or dispose an element or component or portion thereof as suitable to the circumstance and embodiment. In certain cases, the element or component, or portion thereof, can remain in an unchanged position, state, and/or condition as a result of adjustment, if appropriate or desirable for the embodiment under the circumstances. In some cases, the element or component can be altered, changed, or modified to a new position, state, and/or condition as a result of adjustment, if appropriate or desired.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", "inboard", and the like describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second", and other such numerical terms referring to structures do not imply a sequence or order unless clearly indicated by the context.

Unlike imaging and power-feedback systems, thermal tracking for solar systems provides low misalignment error with only a minor cost. The temperature profile of a solar cell receiving solar radiation can provide useful information for properly aligning the solar system containing the cell. As is described in greater detail below, by measuring the temperature at various points in and on the solar module, feedback can be provided to the aligning system to reduce the misalignment error.

A thermal tracking system for a concentrating photovoltaic system is disclosed. The thermal tracking system comprises (i) a photovoltaic receiver extending in a longitudinal direction, the photovoltaic receiver itself comprising (a) a photovoltaic laminate having a first and second edges extending parallel to the longitudinal direction, the photovoltaic receiver having a front side with a front surface, the front side directed to receive concentrated sunlight and a back side with a back surface, the back side opposite the front side, the photovoltaic laminate comprising a plurality of photovoltaic solar cells, and (b) a heat spreader coupled to the back side of the photovoltaic laminate along the longitudinal direction and extending towards the first and second edges of the photovoltaic laminate, the heat spreader stopping short of the first edge and the second edge, (ii) first and second thermal sensors coupled to the photovoltaic laminate, the first thermal sensor closer to the first edge than the second edge, the second thermal sensor closer to the second edge than the first edge, the first and second thermal sensors adapted to sense a temperature of the photovoltaic laminate, and (iii) third and fourth thermal sensors positioned adjacent the heat spreader, the third thermal sensor positioned between the first edge and the heat spreader, the fourth thermal sensor positioned between the second edge and the heat spreader.

A method for tracking the sun for a concentrated photovoltaic system is also disclosed. The concentrated photovoltaic system can comprise a solar receiver comprising a solar laminate and a heat spreader. The method comprises sensing a first temperature in a first location of a photovoltaic laminate, sensing a second temperature in a second location of the photovoltaic laminate, determining a tracking correction for the concentrated photovoltaic system by comparing the first and second temperatures, sensing a third temperature in an upstream position of air flowing over the heat spreader, sensing a fourth temperature in a downstream position of air flowing over the heat spreader, and adjusting the tracking correction for the concentrated photovoltaic system based on information derived from the third and fourth temperatures.

A concentrating photovoltaic system is disclosed. The concentrating photovoltaic system comprises a reflective surface adapted to concentrate sunlight to produce focused sunlight, a photovoltaic receiver positioned to receive the focused sunlight, the photovoltaic receiver comprising a photovoltaic laminate comprising photovoltaic solar cells, first and second thermal sensors positioned contacting the photovoltaic laminate in the concentrating photovoltaic system, a heat spreader in thermal communication with the photovoltaic laminate, the heat spreader having a first open side and a second open side, third and fourth thermal sensors, the third thermal sensor positioned near the first open side of the heat spreader and the fourth thermal sensor positioned near the second open side of the heat spreader, a motor adapted to adjust the position of the concentrating photovoltaic system, and a control system adapted to operate the motor, the control system connected to and receiving information from the first, second, third, and fourth thermal sensors, the control system further adapted to operate the motor in response to a signal received from at least one of the first, second, third, and fourth thermal sensors.

FIG. 1 illustrates a view of a solar system 100 being irradiated by the sun 180. The solar system 100 is a concentrator system, although other solar systems can embody the features described. The solar system comprises a pier 110, a torque tube 120, a cross beam 130, several solar concentrators 140 positioned and maintained by supports 150, and solar receivers 160. The solar system 100 can adjust the position of the solar concentrators 140 to permit concentration of light from the sun 180 onto the solar receivers 160. The solar receivers 160 can be photovoltaic solar cells, or portions thereof, which convert the received sunlight into electrical current. Additional features can be incorporated into the solar system 100. For clarity and descriptive purposes, these are omitted.

Figure 2:
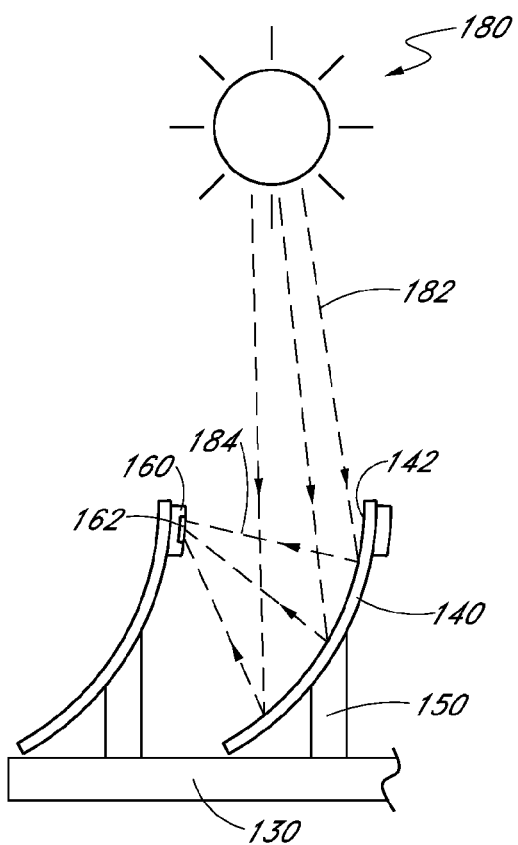
FIG. 2 is a detailed view of a portion of the solar system of FIG. 1.

FIG. 2 illustrates a detailed view of a portion of the solar system 100 of FIG. 1. The solar concentrators 140 can have any of a number of shapes and sizes, such as the parabolic reflectors shown. The reflecting surface 142 can receive unfocused sunlight 182 and reflect and concentrate it into concentrated sunlight 184. The intensity of concentrated sunlight provided to a receiver, such as solar receiver 160, can be referred to by a measure of the intensity of illumination relative to unconcentrated sunlight. For example, a concentrator which provides concentrated sunlight which has twice the intensity of unconcentrated sunlight is said to provide two suns. The illustrated solar concentrator 140 can provide seven suns, although the amount of concentration can vary between embodiments. In certain embodiments, the solar system 100 can operate without a solar concentrator 140, and the solar receiver 160 can receive unconcentrated sunlight.

Preferably, the solar concentrator 140 directs the concentrated sunlight 184 to a predetermined location on the solar receiver 160. The solar receiver 160 includes a photovoltaic solar cell. The concentrated sunlight 184 preferably impinges on the solar cell 162 to permit electrical energy generation. The solar receiver 160 can include several components interoperating to produce electrical energy, as described in greater detail below. One face of the solar receiver 160 can be positioned to face toward the solar concentrator 140, receiving the concentrated sunlight 184. This face preferably includes the photovoltaic solar cell 162. It is desirable to position the solar system 100 such that the concentrated sunlight 184 reflected by the solar concentrator 140 impinges exclusively on the photovoltaic solar cell 162, and not other portions of the solar receiver 160, thereby increasing the electrical output of the solar cell 162 and, consequently, overall system efficiency. FIG. 2 illustrates a position where the concentrated sunlight 184 is appropriately directed.

Figure 3:
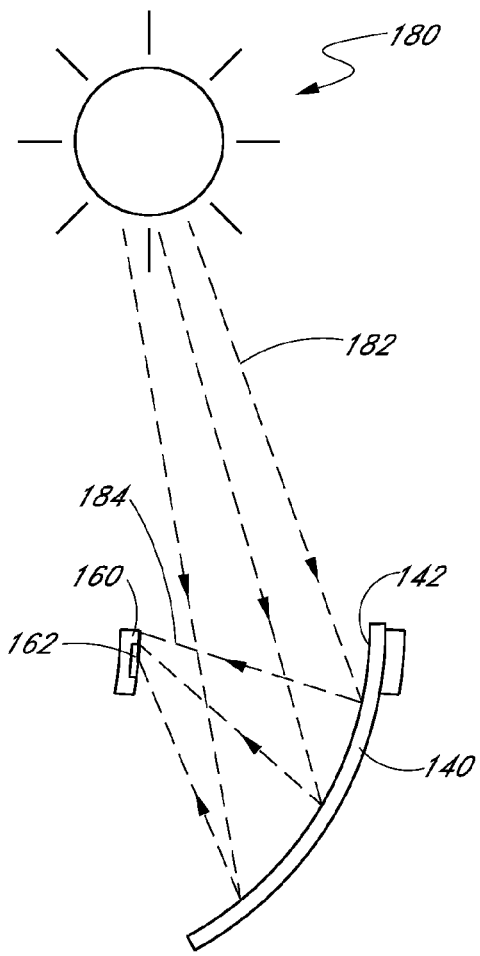
FIG. 3 is a view of a solar concentrator and solar receiver in a first position.

FIG. 3 illustrates a positioning of the solar system 100 wherein the solar concentrator 140 is not properly positioned. In the illustrated position, concentrated sunlight 184 impinges on the high side of the solar receiver 160. A portion of the solar cell 162 is not illuminated by the concentrated sunlight 184, and other components above the solar cell 162, such as an encapsulant, backing, or frame, are instead receiving the concentrated sunlight 184.

Figure 4:
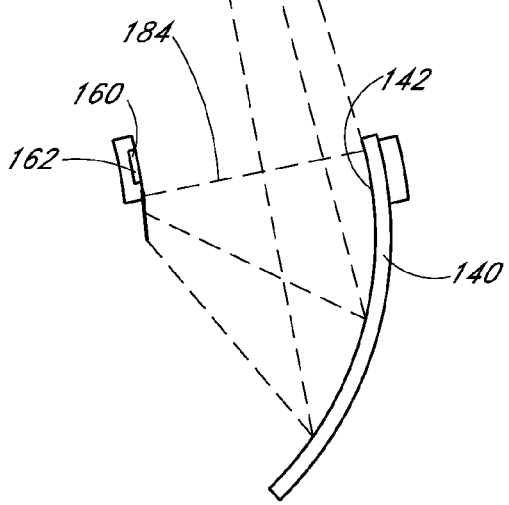
FIG. 4 is a view of the solar concentrator and solar receiver of FIG. 3 in a second position

FIG. 4 illustrates another position of the solar system 100 wherein the solar concentrator 140 is undesirably positioned. In this position, the concentrated sunlight 184 is directed below the solar cell 162. Although some concentrated sunlight 184 can impinge on the solar cell 162 in either position illustrated in FIG. 3 or 4, it is undesirably less than substantially all of the concentrated sunlight 184.

Figure 5:
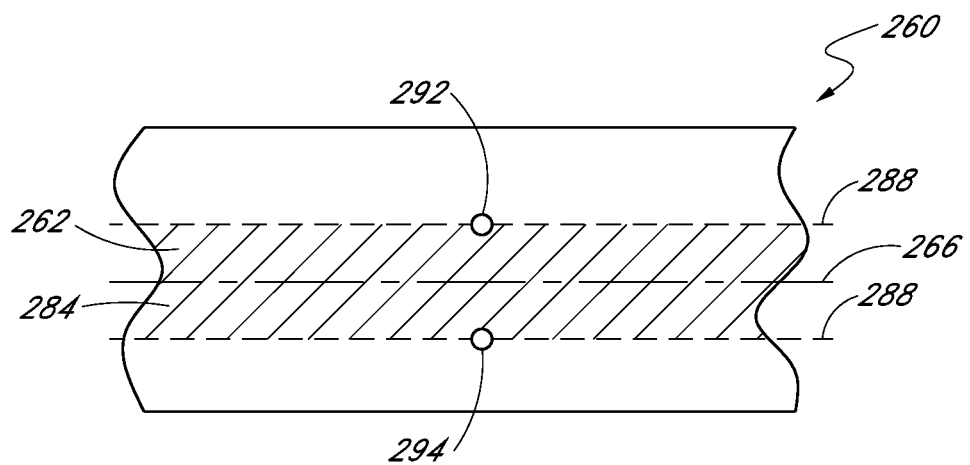
FIG. 5 is view of a solar receiver in a first condition.
Figure 6:
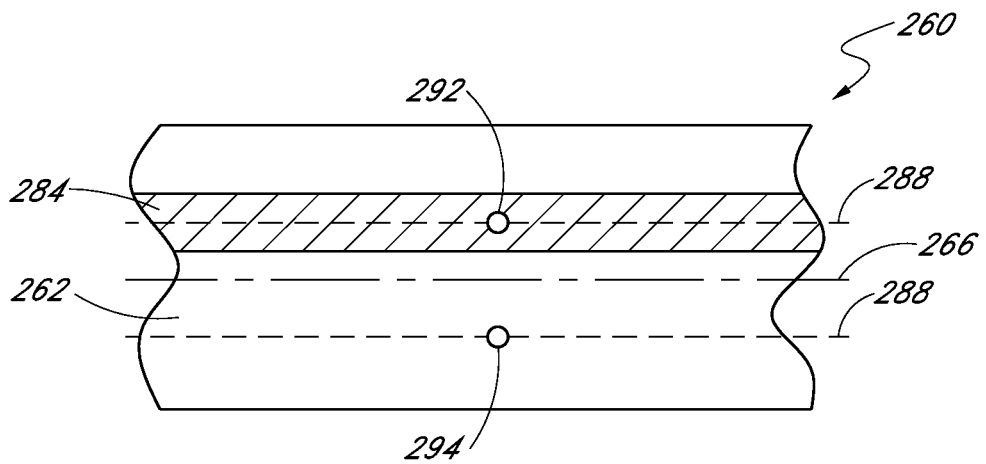
FIG. 6 is a view of the solar receiver of FIG. 5 in a second condition.
Figure 7:
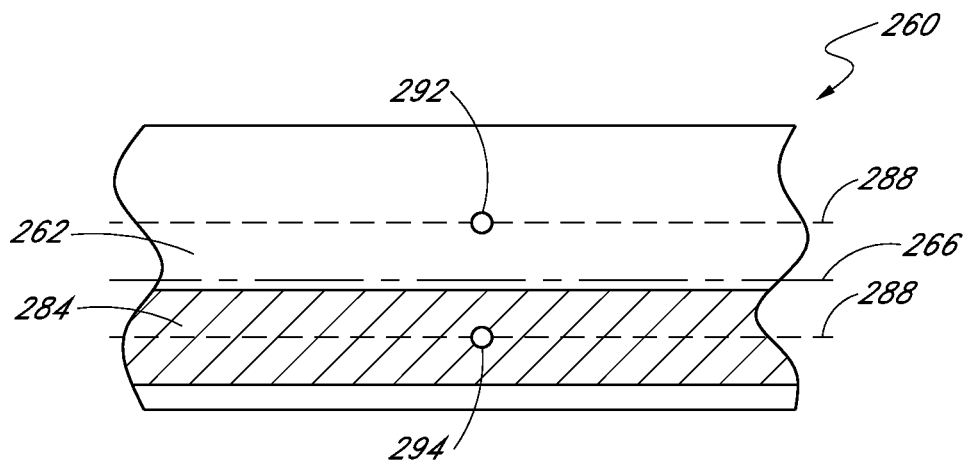
FIG. 7 is a view of the solar receiver of FIG. 5 in a third condition.

FIGS. 5-7 illustrate embodiments of solar receivers 260 receiving concentrated sunlight 284. Unless otherwise indicated, numerical designations for components are similar to those used above in FIGS. 1-4, except that they have been incremented by 100. Additionally, some features and components of the solar system incorporating the solar receivers 260 have been omitted for clarity.

FIG. 5 illustrates a solar receiver 260 having a solar cell 262 extending across its surface. The solar receiver 260 has a centerline 266. In the illustrated embodiment, the centerline 266 also extends across the vertical center of the solar cell 262, although in other embodiments, this need not be the case. The centerline 266 is used for descriptive reference only and does not indicate a functional or actual center. The solar cell 262 has upper and lower bounds 288, and extends horizontally along the solar receiver 260. Concentrated sunlight 284 impinges on the solar cell 262, desirably positioned to on the solar cell 262. In some embodiments, the solar cell 262 can be separated into different segments or sections. In certain embodiments, the solar cell 262 can extend further vertically than the height of the concentrated sunlight 284, and vice versa. Thus, although shown the same height here for ease of description, various embodiments can have different characteristics which still employ aspects of the systems and techniques described.

The solar receiver 260 can also have first and second thermal sensors 292, 294. The thermal sensors 292, 294 are preferably spaced apart in a horizontal or, as shown here, vertical direction. Although shown positioned along the edges of the solar cell 262, as indicated by bounds 288, the thermal sensors 292, 294 can be offset either towards the centerline 266 or away from it. Preferably, however, the thermal sensors 292, 294 are the same distance from the center of the solar cell 262, although they can be different distances, as described below. The thermal sensors 292, 294 can be any type of thermal sensor, such as a thermocouple, resistive temperature detector, thermistor, or other such device. As described below, other types of sensor can be used in different embodiments, such as optical sensors, including those configured to detect and/or measure luminosity. The sensor selected should have sensitivity and reporting frequency characteristics as desired for interoperation with other components, including a control system. Preferably, sensors having sensitivity to a tenth of a degree Celsius and/or a clock cycle of approximately 60 Hz are used, though others with varying characteristics can be used without departing from the spirit of the embodiments described herein.

The thermal sensors 292, 294 can be situated in the solar receiver 260 to detect the temperature in the portion of the solar receiver 260 immediately surrounding the respective sensor. While transient environmental effects can affect temperature measurements at the sites of the thermal sensors 292, 294, the thermal effect of the position of the concentrated sunlight 284 onto the cell 262 predominates. Thus, when the thermal sensors 292, 294 are positioned at approximately equal distances from the center of the concentrated sunlight 284, here co-axial with the centerline 266, they detect approximately the same temperature.

The inventor has discovered that a change in alignment of the concentrated sunlight 284, such as that caused by misalignment error, results in easily detectable temperature difference between two thermal sensors positioned similarly to thermal sensors 292, 294. In some concentrators, depending on the intensity of concentration, the temperature difference can be as much as 8° C. per degree of alignment variation. Although illustrated for clarity as a well-bounded area, concentrated sunlight 284 can, in practice, have a boundary wherein temperature gradually decreases as intensity of irradiance decreases. Because solar concentrators do not have perfect concentration profiles, some boundary variation is present. Nonetheless, temperature measurements at or near a designed or desired boundary location can correspond to prescribed alignment characteristics.

FIG. 6 illustrates a different alignment circumstance, wherein the concentrated sunlight 284 is misaligned. The concentrated sunlight 284 is impinging on less than half of the solar cell 262. The first thermal sensor 292 is positioned within the area of irradiance, while the second thermal sensor 294 is positioned below the area of irradiance. Accordingly, the first thermal sensor 292 will detect a higher temperature than the second thermal sensor 294.

By comparing the temperature difference detected between the first and second thermal sensors 292, 294, the solar system supporting the solar receiver 260 can be operated to a new position which desirably reduces the misalignment or tracking error. Accordingly, a control system is preferably configured to receive information from the thermal sensors 292, 294 and can control one or more positioning motors to change the position of the solar system, thereby changing the position of the solar concentrator directing the concentrated sunlight 284, and more desirably positioning it to impinge on the solar cell 262, such as to a position like the one illustrated in FIG. 5.

In FIG. 7, a reverse case to that illustrated in FIG. 6 is shown. The concentrated sunlight 284 is misaligned downward on the face of the solar receiver 260. Accordingly, the second thermal sensor 294 detects a higher temperature than the first thermal sensor 292. Additionally the inventor has discovered that as the ambient temperature, irradiance, and wind speed globally increases or decreases, the absolute temperature of thermal sensors 292, 294 also increases or decreases at the same rate however the relative temperature difference between thermal sensors 292, 294 is dominated by the location of the concentrated irradiance on the cell 262. Thus, the two sensors working together as an alignment sensor are not sensitive to the changes in weather and global irradiance as other tracking techniques are.

Figure 8:
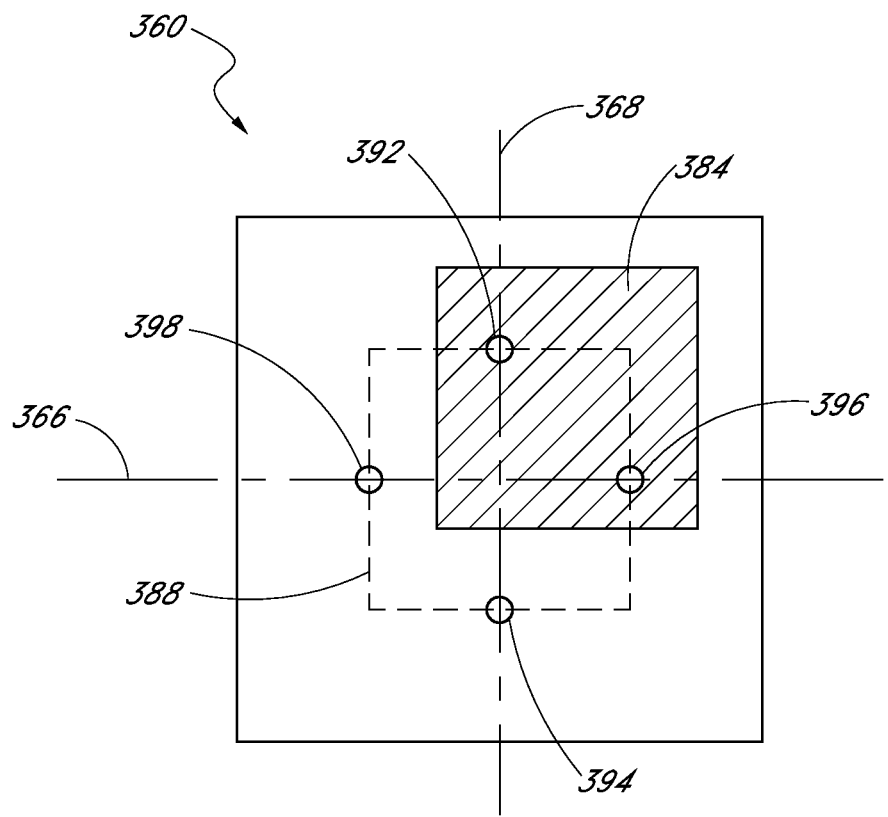
FIG. 8 is a view of another solar receiver in an irradiated state.

FIG. 8 illustrates an embodiment of a solar receiver 360 similar to that shown in FIGS. 5-7. Unless otherwise indicated, numerical designations for components are similar to those used above in FIGS. 5-7, except that they have been incremented by 100.

A two-dimensional system is shown, wherein the misalignment of the concentrated sunlight 384 in two directions is detected. Third and fourth thermal sensors 396, 398 are positioned along the horizontal centerline 366, and offset in the horizontal direction from the vertical centerline 368. Similar to the first and second thermal sensors 392, 394, the third and fourth thermal sensors 396, 398 are preferably substantially the same distance from the vertical centerline 368. The solar receiver 360 can be part of the overall solar system or a separate portion of a solar receiver receiving concentrated sunlight from a solar concentrator, but used exclusively for detecting and correcting misalignment error.

The concentrated sunlight 384 is offset from the centerlines 366, 368 in both horizontal and vertical directions. When positioned as shown, the concentrated sunlight 384 creates a measurable temperature difference in the thermal sensors wherein the first thermal sensor 392 detects a higher temperature than the second thermal sensor 394, and the third temperature sensor 396 detects a higher temperature than the fourth thermal sensor 398. A system controller receiving information from the thermal sensors 392, 394, 396, 398 can therefore adjust the position of the solar system to reduce the misalignment and desirably direct the concentrated sunlight more fully onto the solar cell. The features shown in FIG. 8 can be incorporated into other embodiments, and features described with respect to various other embodiments can be incorporated into an embodiment similar to that shown in FIG. 8.

Figure 9:
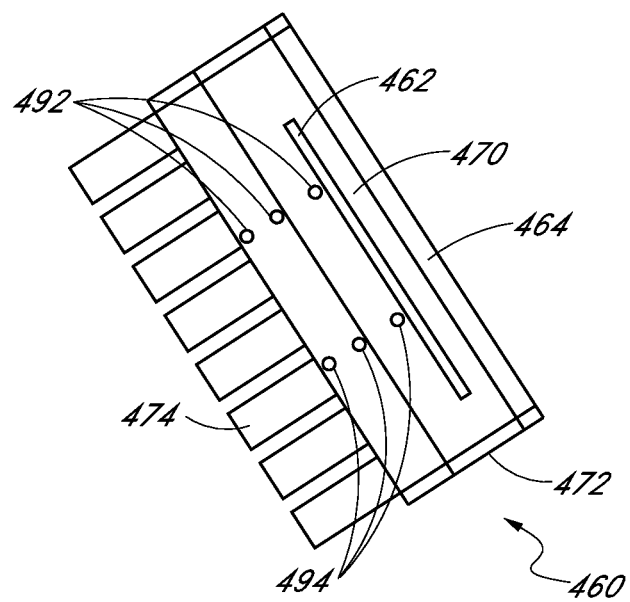
FIG. 9 is a side view of a solar receiver.

FIG. 9 illustrates a cross-sectional view of a solar receiver 460. Unless otherwise indicated, numerical designations for components are similar to those used above in FIGS. 5-7, except that they have been incremented by 200. Multiple possible positions are shown for thermal sensors 492, 494.

The solar receiver 460 can include the solar cell 462, a transparent cover 464, an encapsulent 470, a frame 472, and one or more thermal spreading features 474, among others. The solar cell 462 can be a back-contact, back-junction solar cell, or other type as appropriate. The transparent cover can be a glass or acrylic sheet, preferably including an anti-reflective coating. The encapsulent can surround and support the solar cell 462 beneath the transparent cover 464. The frame 472 can support the solar cell 462, encapsulent 470, and transparent cover 464, as well as a backsheet, or other included components which can vary between embodiments, such as diodes, interconnects, and the like. The thermal spreading features 474 can include fins, as shown, as well as thermal spreaders, including an adhesive or other paste having high thermal conduction properties. The overall solar receiver 460 can be formed as a solar module or solar panel supported by the frame 472.

The first and second thermal sensors 492, 494 can be coupled to the solar cell 462, preferably on the outside surface of the backsheet to allow thermal coupling to the cell after the receiver is manufactured. The thermal sensors 492, 494 can be disposed in and/or surrounded by the encapsulent 470. The thermal sensors 492, 494 can be coupled to a backsheet, if present, or otherwise positioned in the laminate formed around the solar cell 462. When disposed within the solar receiver 460, leads can pass back through the backsheet, exiting either through a perforation, edge or at a junction or seam through which other wiring passes. In certain embodiments, the thermal sensors 492, 494 can be incorporated as semiconductor devices into the solar cell 462.

Alternatively, the thermal sensors 492, 494 can be positioned on the thermal spreading features 474, if desired, including beneath the fins, within the heat-spreading component or thermal adhesive or other location as desired.

In certain embodiments, other types of sensors can be used. For example, pinhole or cylindrical optical sensors can be used to determine intensity of the concentrated sunlight received by the portion of the solar cell immediately surrounding the sensor. In other embodiments, detection of current and/or voltage at a particular location can be used to infer the concentration of sunlight relative to another position at which detection is done and comparison is made. Regardless of the sensor type, the determined misalignment can be used as a basis for controlling the accompanying solar system.

Figure 10:
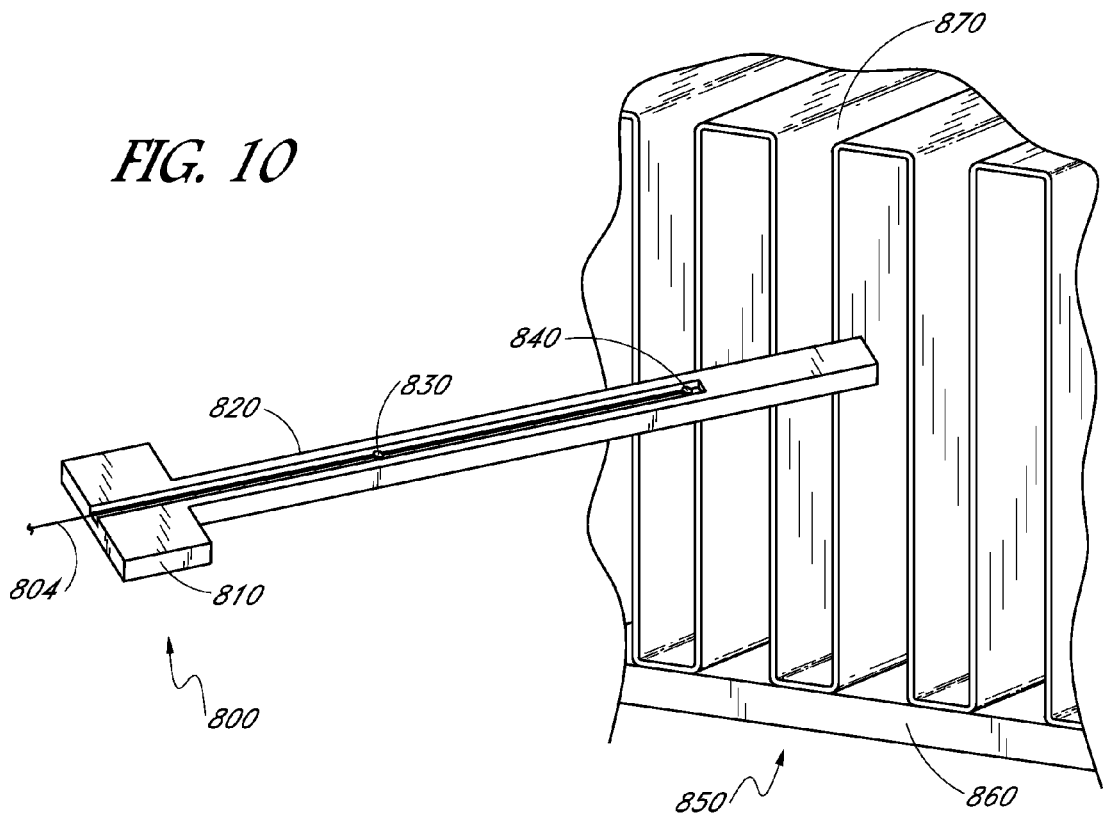
FIG. 10 is an exploded, perspective view of a sensor coupling device and portion of a solar system.

FIG. 10 illustrates an embodiment of a sensor coupling device 800 adjacent a portion of a solar receiver 850. The sensor coupling device 800 can include a crosspiece 810, an extension portion 820, one or more thermal sensors 830, 840, and one or more leads 804 coupled to a thermal sensor 830, 840. The solar receiver 850 comprises a module portion 860 and a fin portion 870. Accordingly, the illustrated embodiment of a sensor coupling device 800 is preferably used in those embodiments where fins are used to spread heat from the module portion 860. Preferably, the fins are spaced away from the module portion 860 somewhere along the length of the module portion to allow the coupling device to contact the module portion directly, and not reside on the fin portion although, in some embodiments, such an arrangement is used.

The sensor coupling device 800 is preferably composed of a material sufficient to maintain a stable shape over the temperature operating range of the solar receiver 850 and preferably of a material with low thermal conductivity so as to not influence the thermal gradient of the solar module. For example, strong plastic or ceramic can be used. The sensor coupling device 800 is preferably sized to fit among the fins of the fin portion 870 against the module portion 860. Therefore, it can be relatively narrow, as shown, or wider if permitted by the fin portion 870. The sensor coupling device 800 can have a crosspiece 810 extending in a direction substantially traverse to the extension portion 820. The crosspiece 810 can extend sufficiently far from the center of the sensor coupling device 800 to obstruct travel of the extension portion 820 between fins of the fin portion 870 when inserted. In this way, the desired positioning of the thermal sensors 830, 840 can be achieved without detailed measurements by relying on physical interference of the components. Accordingly, the thermal sensors 830, 840 are preferably located along the extension portion 820 at positions which cause them to contact the module portion 860 at desired positions when the crosspiece 810 rests against the fin portion 870.

The thermal sensors 830, 840 can function as thermal sensors for a thermal tracking system as described herein. Accordingly, they are preferably positioned at locations on the module portion 870 which permit sensing of thermal effects caused by concentrated sunlight received by the solar receiver 850 during operation of the solar system. Preferably they are spaced apart at an appropriate distance to perform sensing which allows calculation of the appropriate temperature difference. Any number of sensors can be present on a single sensor coupling device 800, as desired for the particular embodiment.

The lead 804 can be a single wire or multiple, extending from one or both of the thermal sensors 830, 840. The lead 804 can extend along the surface of the sensor coupling device 800, or along a channel or groove formed thereon.

The module portion 860 can be a frame, a backsheet, or any other portion of an individual component or assembly of the portion of the solar receiver 850 coupled to the fin portion 870. Thus, other elements comprising the solar receiver 850 can be present below the module portion 860 in the illustrated embodiment, including a photovoltaic solar cell, an encapsulant, and so on. In some embodiments, the fin portion 870 is coupled to the module portion 860 with a thermal adhesive, thermal paste, or other thermal conduction-aiding element.

Figure 11:
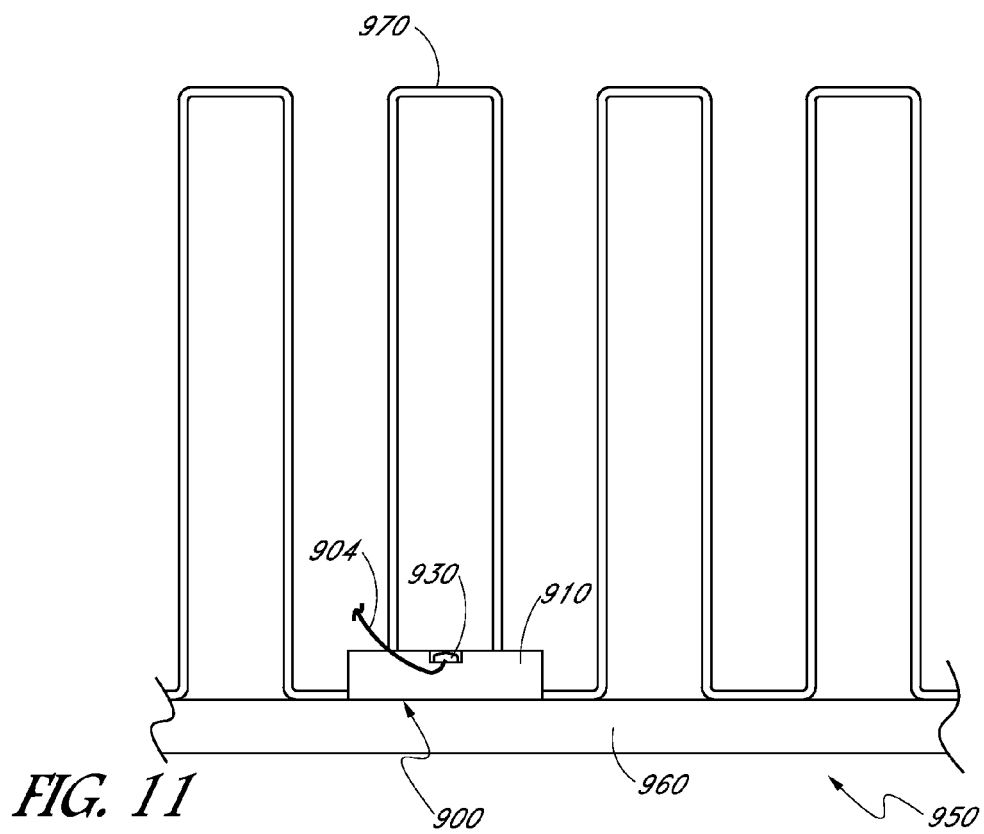
FIG. 11 is an assembled side view of the portion of the solar system of FIG. 10.

FIG. 11 illustrates a sensor coupling device 900 installed against the fin portion 970 of a solar receiver 950. Unless otherwise indicated, numerical designations for components are similar to those used above in FIG. 10, except that they have been incremented by 100. As can be seen, the crosspiece 910 extends sufficiently far out to obstruct travel of the sensor coupling device 900 between two adjacent fins of the fin portion 970.

Figure 12:
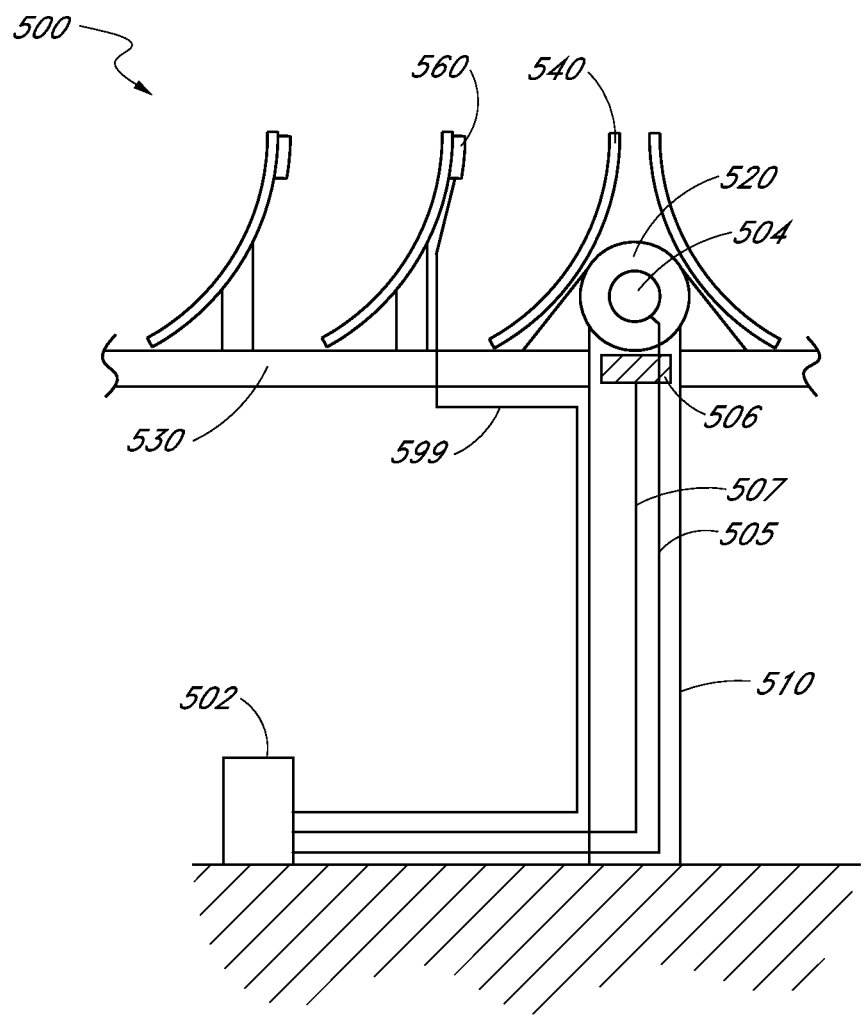
FIG. 12 is side view of a solar system.

FIG. 12 illustrates a solar system having features similar to those described above with respect to FIG. 1. Unless otherwise indicated, numerical designations for components are similar to those used above in FIG. 1, except that they have been incremented by 400. The torque tube 520 can be supported and adjusted by an elevation motor 504. Similarly, an azimuth motor 506 can support and position the torque tube 520 in a direction perpendicular to the elevation motor 504. Although one arrangement of motors is shown, other combinations can be used to adjust the position of components of the solar system 500, such as the torque tube 520 and one or more cross beams 530, thereby adjusting the position of the solar concentrators 540 and solar receivers 560. One non-limiting example is a solar system 500 at an inclined angle where one motor controls the angle of inclination, while another rotates the system about the axis of inclination.

Sensor leads 599 are shown extending from a solar receiver 560 to a control system 502. The location and travel of the leads 599 can extend along any desired path. Similarly, the particularly solar receiver 560 need not be the one to incorporate sensing features, or several or all of the solar receivers 560 of the solar system 500 can incorporate sensors. Accordingly, information conveyed from the sensing features to the control system 502 can be using a single set of leads or a plurality, depending on the embodiment.

The control system 502 can receive information from the sensing features through the sensor leads 502. The control system 502 can, in response, operate either or both of the elevation and/or azimuth motors 504, 506 to reduce the detected and interpreted misalignment error. The control system 502 can be a single device, such as a field-programmable gate array (FPGA), general purpose computer, or other micro-processor device, or a feature of such an electronic processing device which performs control operations for the solar system 500. The control system 502 can also be a voltage combiner and an amplifier that signals the motor 504 or 506 to step when the voltage reaches a threshold value.

Figure 13:
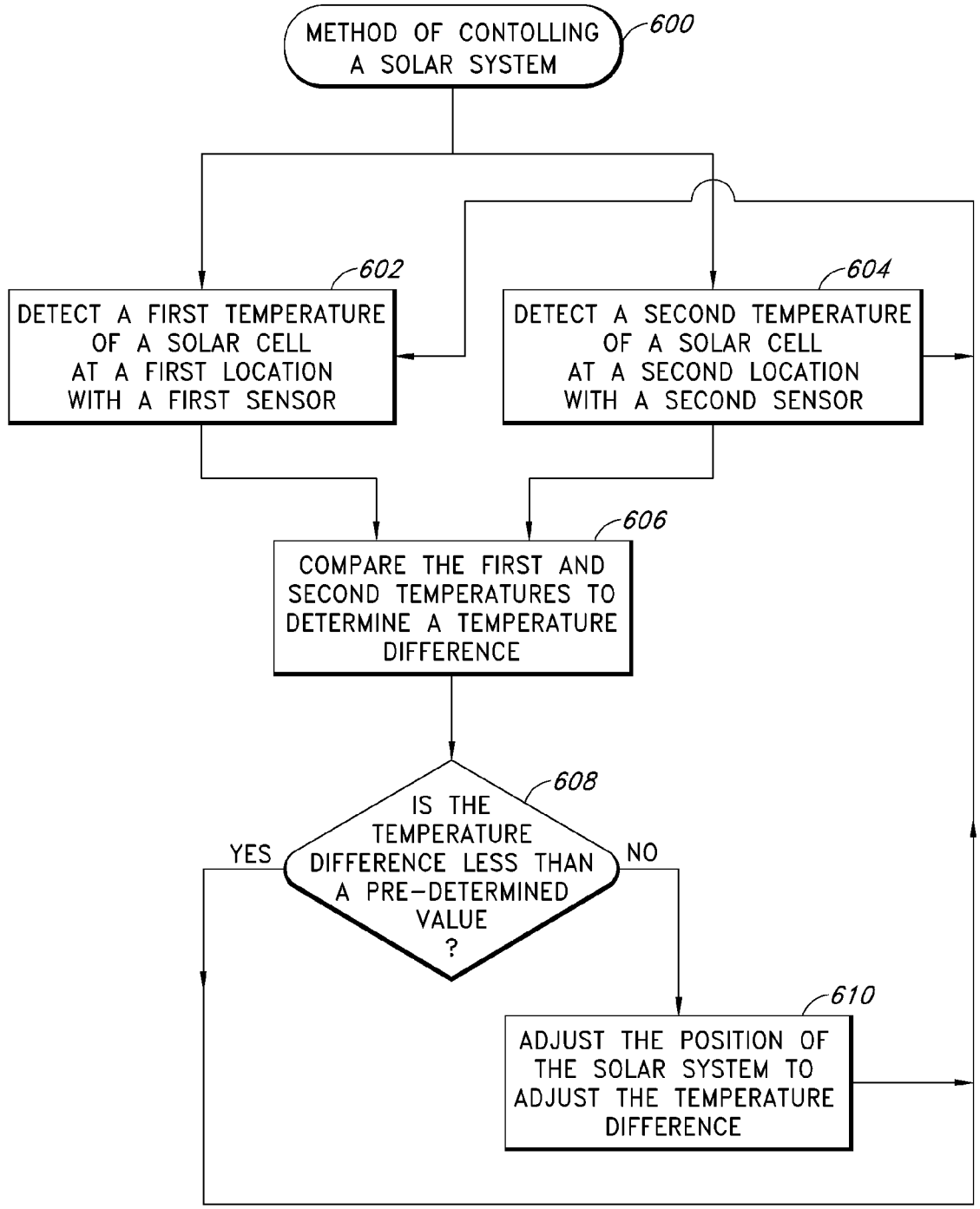
FIG. 13 is a flowchart diagram of a method of controlling the position of a solar system.
Figure 14:
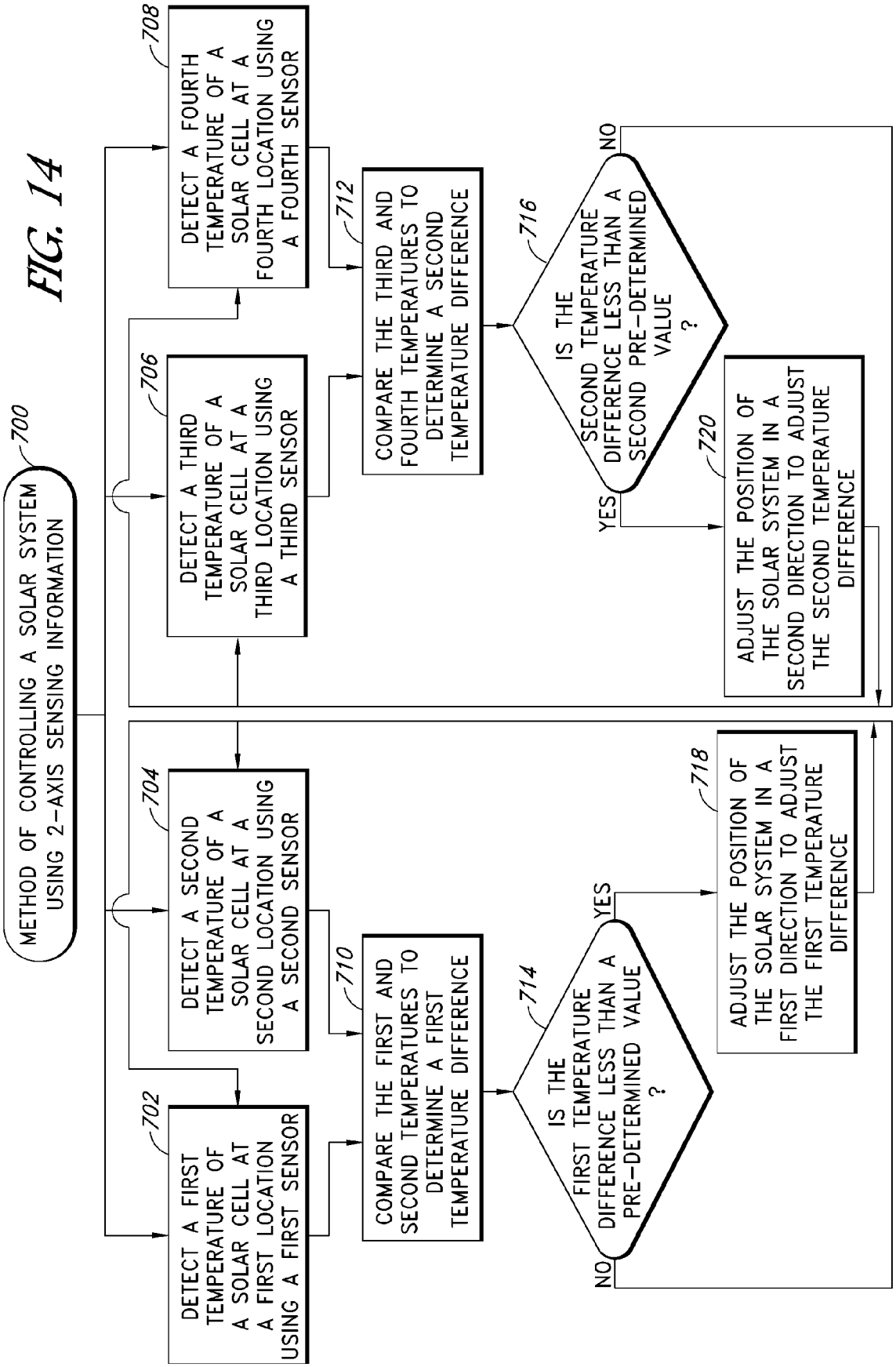
FIG. 14 is a flowchart diagram of another method of controlling the position of a solar system.

The flowcharts and schematics described below, such as and including those in FIGS. 13 and 14, show flowchart diagrams describing techniques suitable to solar systems embodying some of the features described herein. The various tasks performed in connection with any of the described, including methods 600, 700, can be performed by software, hardware, firmware, or any combination thereof. For illustrative purposes, the following description of methods 600, 700 may refer to elements mentioned above in connection with FIGS. 1-12. In practice, portions of the methods 600, 700 can be performed by different elements of the described system, e.g., temperature sensors 292, 294, control system 502, and/or elevation or azimuth motors 504, 506. It should be appreciated that any of the illustrated methods, including methods 600, 700, can include any number of additional or alternative tasks, the tasks shown in the flowchart diagrams need not be performed in the illustrated order, and the described methods may be incorporated into a more comprehensive procedure or process having additional functionality not described in detail herein.

FIG. 13 illustrates a method 600 of controlling a solar system. A first sensor is used to determine a first temperature at a first location on or near a solar cell 602. As described above, the sensor can be a thermal sensor, such as a thermocouple or RTD. When determining the first temperature, the sensor can provide any of a number of different types of information for use in the determination. For example, the first sensor, as with all sensors, can provide a voltage from which an associated temperature can be obtained. Similarly, a temperature value can also be provided. Additional types of information allowing determination of temperature at the location of the sensor can be provided by different sensor types. A control system can receive the information from the first and second sensors, as shown in FIG. 12.

A second sensor can be used to determine a second temperature at a second location on or near the solar cell 604. The first and second temperatures can be compared to determine the temperature difference, or temperature gradient, across the solar cell 606. By determining the temperature difference, the angle of misalignment or tracking error or positioning error can be determined from a known temperature profile for the solar system. For example, when a temperature difference of about 10° C. per angle of misalignment is known to occur in the system, if the temperature difference is 15° C. is present, it can be inferred that the angle of misalignment is approximately 1.5°.

If it is preferred that the solar receivers operate with zero temperature difference between the first and second sensors, a control system can adjust the position of the solar system to reduce the temperature difference to approximately zero. In some embodiments, however, it can be desirable to reach a predetermined temperature gradient, rather than a zero temperature difference. For example, if the centerline of a solar cell is offset from the centerline between two thermal sensors, it might be desirable to create a specified temperature difference to properly center concentrated sunlight on the center of the solar cell as opposed to the centerline between the sensors.

Accordingly, in some embodiments, it can be desirable to increase the temperature difference to reach a predetermined value.

Thus, after determining the temperature difference, an evaluation as to whether the temperature difference is equal to, less than, or greater than a predetermined value 608. In the event that, for example, a zero temperature difference is desired, and a substantially zero temperature difference is present, the method 600 can repeat to monitor for temperature differences outside the desired value. As used herein, substantially means that a value is within a defined tolerance of a predetermined value. For example, while a zero temperature difference is desirable, a value of temperature difference less than 0.01° C. might be considered acceptably close to zero for adjustment purposes.

In some embodiments, a temperature variation can be compared as an absolute value to a certain, predetermined threshold value, such as 0.05° C. Any temperature differences below the threshold value can be ignored, so as to reduce sensitivity to small variations due to system imperfections or ambient conditions which create a small, transient temperature difference. In certain embodiments, tracking can be performed by an alternate method, such as by using sun tables or light-tracking, with thermal tracking techniques used only when the temperature variation exceeds the threshold value.

Additionally, in some embodiments, it can be desirable to direct concentrated sunlight in a manner that produces an irradiant pattern which is not centered between the two thermal sensors. In such embodiments, the predetermined, desirable temperature difference between the two sensors will be non-zero, and either positive or negative depending on the sensor arrangement. Accordingly, in some embodiments, it may be desirable to adjust the position of the solar system to create a temperature difference, or increase it, if necessary to better align the solar system or to adjust the solar system to a more advantageous position.

Thus, if the temperature difference exceeds the predetermined value, as in the case of a desired zero difference, or is unacceptably variant from a predetermined value, the position of the solar system can be adjusted to reduce the inferred angular misalignment 610. Such adjustment can be performed by using a motor, such as an elevation motor. Preferably, the adjustment reduces the angular misalignment, thereby increasing the electrical energy output of the solar cell and overall solar system efficiency. After such an adjustment, the method 600 can be repeated as necessary to maintain desirable angular positioning. In some embodiments, several sensor areas can be evaluated to determine an overall or average detected misalignment for correction by a central controller. The sensors can be detecting temperature signals from the same cell, the same receiver, or from several cells or modules distributed across the overall solar system.

FIG. 14 illustrates a method 700 of controlling a solar system using two-axis sensing and positioning, such as in the exemplary embodiment of FIG. 8. A first sensor can be used to detect a first temperature at a first location on a solar cell 702. A second sensor can be used to detect a second temperature at a second location on the solar cell 704. Preferably, the first and second sensors are disposed along one direction across the solar cell or solar receiver. A third sensor and fourth sensor can be used to detect third and fourth temperatures at a third and fourth location on the solar cell, respectively 706, 708. Preferably, the third and fourth sensors are disposed along a second direction across the solar cell or receiver, the second direction substantially perpendicular to the first direction. The offset between any of the sensors can be chosen as desired.

The first and second temperatures can be compared to determine a first temperature difference 710. Similarly, the third and fourth temperatures can be compared to determine a second temperature difference 712. Each temperature difference can be used to determine a temperature gradient across the solar cell in the perpendicular directions. As described above with reference to method 600, the first temperature difference can be compared to a first predetermined value to ascertain whether the temperature difference correlates to an angular misalignment beyond the desired value 714. As described above, the predetermined value can be any value, including a chosen value or zero temperature difference. Similarly, the second temperature difference can be compared to a second predetermined value to determine if it exceeds the prescribed value 716. The first and second predetermined values can be the same, or different, as desired for the embodiment.

If the comparison of the first temperature difference to the first predetermined value is within an acceptable range, the method 700 can repeat as necessary. Similarly, an acceptable second temperature difference can result in repeating the method 700 for the use of the third and fourth sensors. The first and second sensors can operate at the same clock cycle as the third and fourth sensors, or on an asynchronous manner, as desired.

When the comparison of the first temperature difference to the first predetermined value correlates to an unacceptably large angular misalignment of the solar system, the position of the solar system can be adjusted 718. Because the first and second sensors are positioned along a first direction, the correlation to the solar system's position is only for one axis of the system. Thus, for example, for vertically-offset sensors, the solar system's misalignment is corrected by adjusting the solar cell's position about a horizontal axis. Similarly, for horizontally-offset sensors, the misalignment can be corrected by adjusting the solar cell's position about a vertical axis.

While positioning of a solar cell is used for exemplary purposes, in certain embodiments, adjusting the position of the solar system can result in repositioning of the solar receiver and/or solar concentrator in one or more directions simultaneously to achieve the same result. Similarly, a temperature difference detected by vertically-offset sensors can, in certain embodiments, result in adjusting of position of the solar system about an axis extending in substantially the same direction as the sensor offset but, because of the arrangement of the components, results in reduction of the angular offset. Thus, while certain directions are used for descriptive purposes herein, the actual sensor offsets and position changes can be in a variety of directions.

Thus, the second temperature difference can be compared to a second predetermined value 716 and, when the comparison results in a determination that undesirably large angular misalignment exists, the position of the solar system can be adjusted in a second direction 720. As with the first adjustment 718, the actual axis of rotation in a second direction can be aligned with the offset direction of the third and fourth sensors or another direction, as desired for the embodiment. Therefore, while in at least one embodiment the first and second sensors correlate to misalignment along an elevation axis and the third and fourth sensors correlate to misalignment along an azimuth axis, in other embodiments, the reverse can be true, or each sensor set can correlate to different axes.

Figure 15:
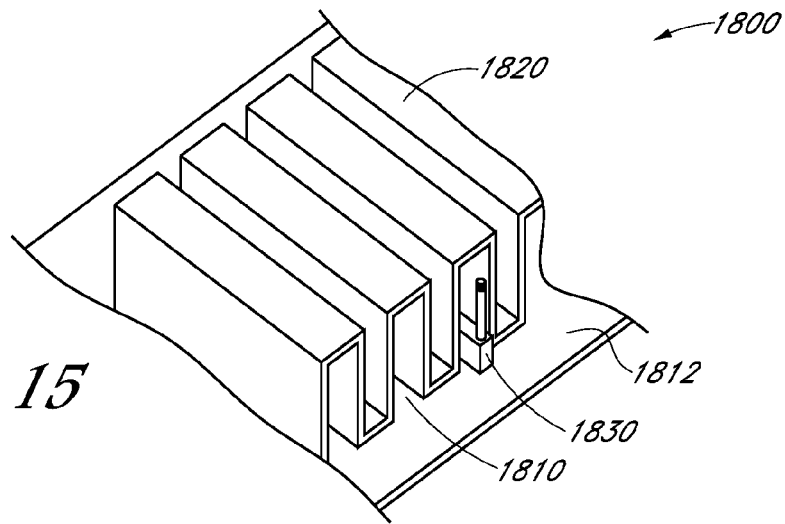
FIG. 15 is a perspective view of an alternative embodiment of a solar receiver having a sensor coupling device.

FIGS. 15-18 illustrate another embodiment of a thermal tracking system for a concentrating solar system, including a concentrating photovoltaic system. Many of the elements described with reference to FIGS. 15-22 are similar to elements described above with reference to FIGS. 1-14. For example, when reference is made to a thermal sensor, it should be understood that the thermal sensor is of the types and produces the output signals described previously. FIG. 15 illustrates a perspective view of a portion of a photovoltaic receiver 1800, similar to the photovoltaic receivers described above. The photovoltaic receiver 1800 comprises a photovoltaic laminate 1810, a heat spreader 1820, and a thermal sensor coupling device 1830. With additional reference to FIG. 16, a cross-sectional view of the portion of the photovoltaic receiver 1800 is shown.

The photovoltaic laminate 1810 can comprise a backsheet 1812, encapsulant 1814, photovoltaic solar cells 1816, and a transparent cover 1818. The illustrated photovoltaic laminate 1810 includes a number of components which may or may not be present in any particular embodiment. For example, in certain embodiments, the transparent cover 1818 can be omitted. In other embodiments, the backsheet 1812 can be omitted. In yet other embodiments, additional elements can be present. For example, a thermal adhesive or heat-spreading insert can be disposed between the encapsulant 1814 and heat spreader 1820. As another example, an interconnect can be present between individual solar cells 1816, and such interconnect can include a bypass diode in some embodiments. These and other similar features are omitted for clarity of illustration and discussion of thermal tracking techniques.

The encapsulant 1814 can surround and enclose the solar cells 1816. The encapsulant 1814 can be selected from any desired material, and can be present on both sides of the solar cells 1816. The solar cells 1816 can be front- or back-contact solar cells, including back-contact, back-junction solar cells, such as those manufactured by SunPower Corporation of San Jose, Calif. The solar cells 1816 can have a sunny, front, or operational side which is designed, configured, and intended to be positioned toward sunlight, whether natural, or concentrated, to convert said sunlight into electricity. The photovoltaic laminate 1810 and, correspondingly, photovoltaic receiver 1800 can be said to have a similar sunny, front, or operational side disposed to receive sunlight. The opposite, back, or rear side is the other side, disposed and facing away from the received sunlight. It should be appreciated that in a concentrating photovoltaic solar system, such as one that might employ photovoltaic receiver 1800, the front side of the receiver 1800 might not face toward the sun, but may instead receive sunlight from a reflective surface, such as a concentrating mirror, including a solar concentrator, such as 140 above.

The heat spreader 1820 can be of a folded fin design coupled to the rear side of the photovoltaic laminate 1810. The heat spreader 1820 can have an open first side 1822 and open second side 1824. Air can flow through the heat spreader 1820 over its surfaces, thereby transferring heat from the heat spreader 1820 to the surrounding environment. Certain solar concentrator systems employing thermal tracking techniques described herein can use heat spreaders, such as folded fin heat spreader 1820, to improve the performance of the photovoltaic laminate 1810 by reducing its operating temperature through passive cooling. In some embodiments, air channels and deflectors can be used to direct air in a particular manner over the heat spreader 1820. Additionally, in some operating conditions, the surrounding environment can be windy or otherwise have air flowing over and through the heat spreader 1820. The heat spreader 1820 can extend only partially along the photovoltaic laminate 1810, stopping short of either edge, whether closer to the first side 1822 or the second side 1824.

Although referred to as a heat spreader, the heat transfer device can be, or be referred to as, a heat sink, a heat exchanger, or other any heat management device, including those which use are adapted to transfer heat from the photovoltaic laminate 1810 to the surrounding environment. In certain embodiments, the heat transfer devices are passive components, while other embodiments can incorporate active cooling elements, such as forced fluid cooling.

Regardless of the circumstances causing the air to flow over the heat spreader, and regardless of whether air is entering from the first side 1822 or second side 1824, air traveling through the heat spreader 1820 can affect the temperature profile of the heat spreader 1820 and, because of the thermal communication between the heat spreader 1820 and the photovoltaic laminate 1810, similarly affect the temperature profile of the photovoltaic laminate 1810. Thus, while it may be useful to determine a thermal gradient in the laminate for purpose of thermal tracking, it may be additionally useful to account for any discrepancy caused by air flow past the laminate or over an adjacent heat spreader.

Figure 16:
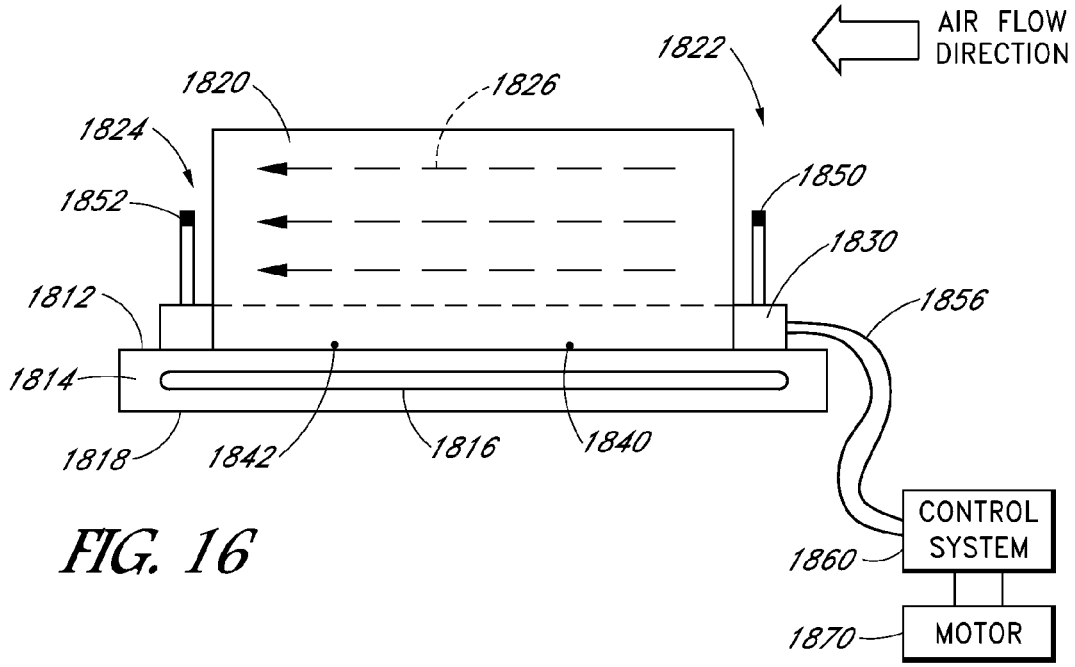
FIG. 16 is a cross-sectional view of the solar receiver of FIG. 15.

With reference to FIG. 16, the direction of air flow is shown. Relatively cooler air from the ambient environment enters the open first side 1822 and passes horizontally (as shown) through the heat spreader 1820 to exit the open second side 1824. Accordingly, the heat spreader 1820 can be cooler near the first side 1822 and relatively warmer near the second side 1824. The first thermal sensor 1840 positioned nearer the first side 1822 can thus experience a slightly cooler temperature than the second thermal sensor 1842 positioned near the second side 1824, even when concentrated sunlight is directed without misalignment onto the photovoltaic receiver 1800, as specified above. This discrepancy in temperature caused by air flow through the heat spreader 1820 can produce a thermal gradient measured by the first and second thermal sensors 1840, 1842 unrelated to the position of the band of concentrated sunlight received by the photovoltaic receiver 1800. If these measurements are uncorrected in these conditions, the solar system may adjust its position in response to the thermal gradient, undesirably and counterproductively introducing misalignment of the sunlight to the receiver.

The embodiment of a photovoltaic receiver 1800 illustrated in FIGS. 15-18 includes third and fourth thermal sensors 1850, 1852. The third thermal sensor 1850 is positioned near the open first end 1822, while the fourth thermal sensor 1852 is positioned near the open second end 1824. In some embodiments, the third and fourth thermal sensors 1850, 1852 are offset or spaced apart from the photovoltaic laminate 1810, such as on a post or spacer extending outward from the laminate 1810. The third and fourth thermal sensors 1850, 1852 can be positioned in the flow of air passing through the heat spreader 1820 through the first and second ends 1822, 1824. The sensor 1850 is disposed between one edge of the laminate 1810 and the spreader 1820. Additionally, the sensor 1852 is disposed between the opposite edge of the laminate 1810 and the heat spreader 1820. It will be apparent to one of skill in the art that the direction of air flow indicated and numbering of the thermal sensors is not limiting, and reversed air flow and/or consideration of the thermal sensors in reverse order is consistent with the techniques described herein.

For use in reference throughout, the first and third sensors 1840, 1850 correspond to positions higher in a vertical direction than the second and fourth sensors, 1842, 1852 respectively while the solar system 1800 is at a horizontally-level, noon position with the sun directly overhead. Thus, with reference to FIG. 2, the first and third sensors 1840, 1850 would be positioned in the receiver 160 closer to the sun 180, the upper or sunward side, while the second and fourth sensors 1842, 1852 would be closer to the cross beam 130, or the lower or earthward side. This convention is used throughout, although the sensor orientations can become inverted during extreme rotation angles from the horizontally-level position.

The each of the thermal sensors 1840, 1842, 1850, 1852, alone or in combination, such as a serial connection, or two serial connections thereof, can be coupled and/or connected, such as electrically connected, to a control system 1860. The control system 1860 can receive signals, whether signals conveying temperature or voltages providing measurements from which the value of temperature can be derived, from each of the thermal sensors 1840, 1842, 1850, 1852. In certain embodiments, the thermal sensors can be connected in series and, consequently, the control system 1860 can receive only a resultant signal, such as a resultant voltage.

In some embodiments, one or more of the thermal sensors 1840, 1842, 1850, 1852 can be connected in reverse polarity to another of the thermal sensors 1840, 1842, 1850, 1852. For example, with additional reference to FIG. 17, the first and second thermal sensors 1840, 1842 can be connected in series, but in reverse polarity to each other, as shown. Likewise, the third and fourth thermal sensors 1850, 1852 can be similarly connected. A reverse polarity connection exists in the arrangement shown, where the positive terminals of two consecutive sensors in the serial circuit are connected. In a normal serial circuit, the connection between two sensors would be from the positive terminal of one sensor to the negative terminal of the next sensor in series.

The connections 1844, 1854 between each pair of sensors, as well as the connection between any pair of sensors for any embodiment described herein, can be of a material type with low variation in electrical resistance over temperature. Some exemplary materials are constantan and manganin, among others with similar constant resistivity over a wide temperature range. In certain embodiments, copper can be paired with other materials in the construction of the sensors. In some embodiments, the thermal sensors can be incorporate several different material choices for different components or for the interconnection between different components.

Any sensor described herein can include an electrical connection which is formed by extending a wire or other conductor of any desired material to a second electrical connection. Particularly, in some embodiments, constantan connections can be made between sensors. The second electrical connection can be included as part of a second sensor, thus joining two paired sensors. Either or both electrical connection can form the basis for a sensor by taking advantage of a thermoelectric effect to produce a voltage that varies with temperature. Thus, the embodiments of sensors described herein need not be discrete components, but can include integrated elements which produce the desired temperature- or thermal-sensing properties for the embodiments of thermal tracking systems.

The effect of a reverse polarity connection is particularly useful when the difference in value between two sensors in desired. For example, in determining the existence, magnitude, and direction (sign) of a thermal gradient, the difference between two sensor readings is at issue, not the value of the sensor readings themselves. Thus, for the embodiment where the thermal sensors 1840, 1842, 1850, 1852 produce a varying voltage in response to a measured temperature, it may be that a thermal gradient in the photovoltaic laminate can be determined from the arrangement shown in FIG. 17. If, for example, the concentrated sunlight were misaligned to the sunward side of the receiver, the first sensor 1840 would produce a higher voltage than the second sensor 1842. The reverse polarity connection would result, however, in a voltage value equal to the difference between the two being received, measured, or detected by the control system 1860. As the control system operated the motor 1870 to adjust the position of the solar system in response, the concentrated sunlight band would travel downward, closer to the second sensor 1842. The voltage detected in the serial circuit of the first and second sensors 1840, 1842 correspondingly would be reduced to zero as the thermal gradient measured between the sensors 1840, 1842 was minimized. The control system 1860 could then cease adjustment of the position of the solar system via motor 1870.

Figure 17:
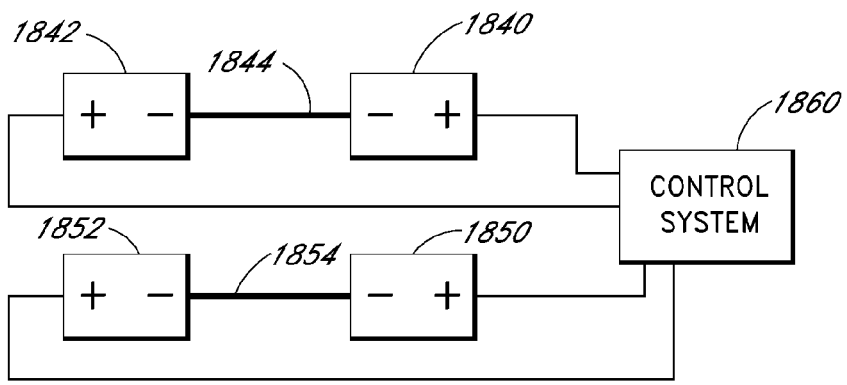
FIG. 17 is a schematic representation of the electrical of an embodiment of a thermal tracking system.

Similar to the measurement of a thermal gradient in the photovoltaic laminate for purpose of aligning the concentrated sunlight on the receiver, a second, correcting thermal gradient can be determined based on comparison of the values produced by the third and fourth thermal sensors 1850, 1852. The second thermal gradient can be determined via a reverse polarity arrangement, as illustrated in FIG. 17, similar to that arrangement described above for the first and second thermal sensors 1840, 1842. In certain embodiments, it should be noted, neither first paired sensors 1840, 1842 nor the second paired sensors 1850, 1852 are connected in series. In some embodiments, some or all of the sensors 1840, 1842, 1850, 1852 can be connected directly to the control system 1860, each providing a signal conveying information from the sensor directly to the control system 1860. Any gradient determination or correction can then be performed using operations within the control system 1860.

In certain embodiments, the second thermal gradient can be used to augment and inform the adjustment of position of the solar system, such as by a motor or control system. For example, if the magnitude of the second thermal gradient is undetectably small, below a predetermined threshold value, or zero, the control system 1860 can operate in response to information received from the first and second sensors 1840, 1842 only. If, however, the magnitude of the second thermal gradient exceeds a threshold detection value, the operation of the control system 1860, particularly with respect to adjustment of the position of the solar system via motor 1870 can be modified in response to the detection of the second thermal gradient.

In the example arrangement shown in FIG. 16, should the air flow through the heat spreader 1820 be sufficiently unidirectional to affect the heat profile in the photovoltaic laminate 1810, the second thermal gradient will be measurable. The value of temperature sensed by the fourth sensor 1852 will be higher than the value of temperature sensed by the third sensor 1850. This is because cool air entering the first open side 1822 of the heat spreader 1820 will warm as it travels along and through the heat spreader 1822. When exiting through the second open side 1824, the air surrounding the fourth sensor 1852 will be warmer than when it flowed past the third sensor 1850 and into the first open side 1822. Accordingly, the fourth sensor 1852 will, for those embodiments where the sensors produce a voltage in response to a sensed temperature, produce a higher voltage than the third sensor 1850. The circuit arrangement shown in FIG. 17 illustrates how the control system 1860 can receive this information as a voltage value, even though the difference in temperatures is being measured. It should be noted that the sign convention described herein is arbitrary and only serves as an example the opposite sign conventions may also be used as long as consistency is maintained throughout the system.

Where the control system 1860 would normally adjust the position of the solar system via motor 1870 to compensate for the misalignment indicated by the first thermal gradient, the amount of adjustment can itself be adjusted as a result of the information regarding the second thermal gradient. If, for example, the first thermal gradient sensed by the first and second sensors 1840, 1842 would normally indicate a reduction in misalignment by positioning the solar system such that the concentrated sunlight was further to sunward, but the second thermal gradient indicated substantially the entirety of the first thermal gradient was a result of a thermal profile in the photovoltaic laminate (or other plane of positioning of the thermal sensors) caused by air flow through the heat spreader, the magnitude of adjustment of position of concentrated sunlight could be reduced or eliminated. In this way, certain embodiments of the thermal tracking system recognize that the first thermal gradient can exist even when the concentrated sunlight is appropriately and desirably aligned on the photovoltaic receiver. The measurement of the second thermal gradient can inhibit movement of the solar system to attempt to correct a first thermal gradient which is caused by air flow, rather than sunlight misalignment.

Figure 18:
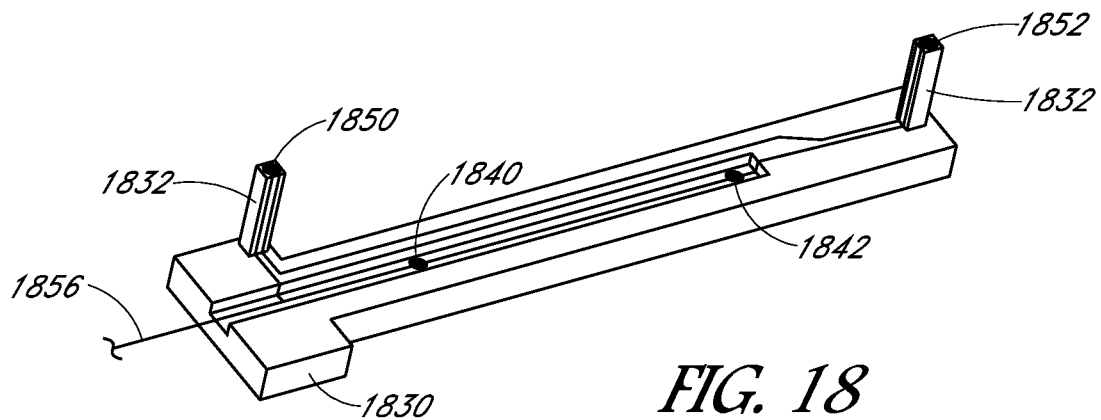
FIG. 18 is a perspective view of an embodiment of a sensor coupling device.

FIG. 18 illustrates one embodiment of a thermal sensor coupling device 1830 which can be used to position the thermal sensors 1840, 1842, 1850, 1852. The wire 1856 shown emanating from the thermal sensors 1840, 1842, 1850, 1852 is simplified for clarity and in different embodiments, several wires can be present connecting the thermal sensors 1840, 1842, 1850, 1852 to the control system 1860, either one per circuit or one per sensor. The illustrated embodiment of thermal sensor coupling device 1830 illustrates offset portions 1832 for increasing elevation of the third and fourth sensors 1850, 1852, which can place them in the flow of air through the heat spreader 1820.

Figure 19:
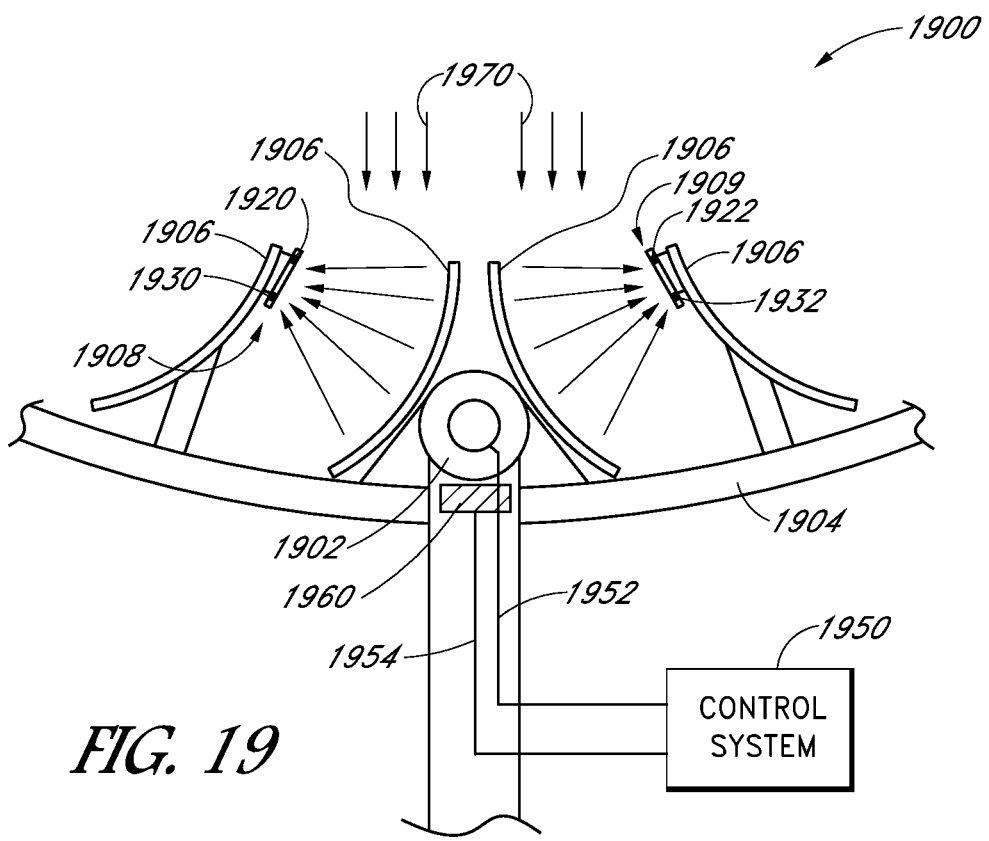
FIG. 19 is an end view of a solar system comprising another embodiment of a thermal tracking system.
Figure 20:
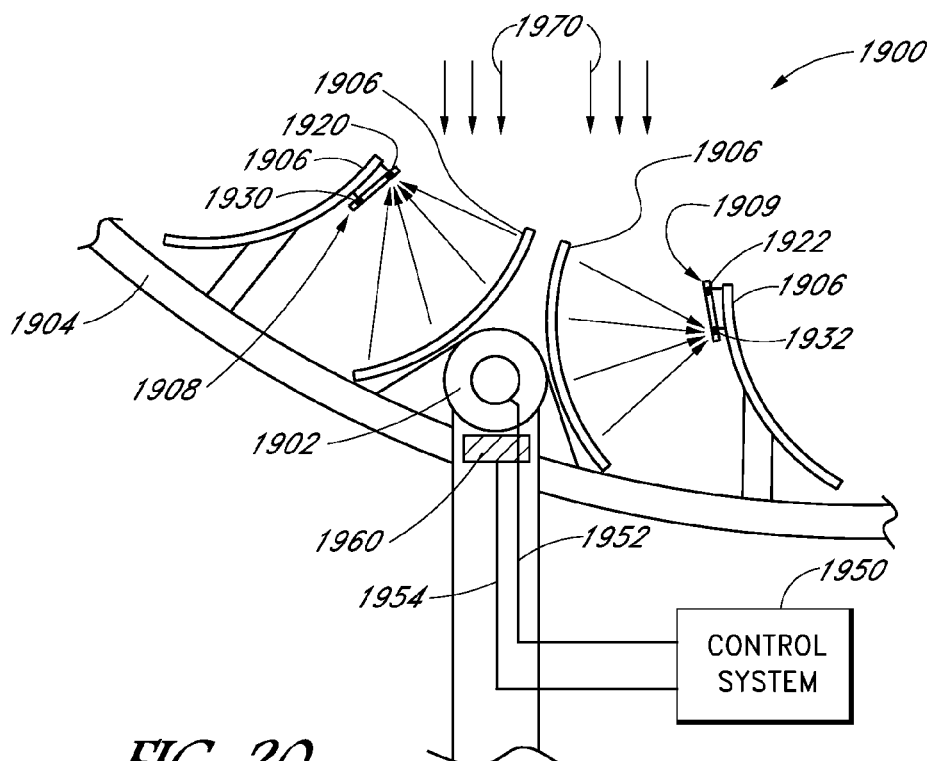
FIG. 20 is an end view of the embodiment of the solar system in FIG. 19 in another orientation.

FIGS. 19 and 20 illustrate a solar system 1900 with an alternative embodiment of thermal tracking system. The solar system 1900 is comprised of a torque tube 1902, cross beam 1904, plurality of reflector elements 1906, and receiver elements 1908, 1909. Two symmetric receiver elements 1908, 1909 can each comprise a photovoltaic laminate with at least two thermal sensors coupled to it. For example, the first receiver element 1908 can comprise a first upper thermal sensor 1920 and a first lower thermal sensor 1930. The second receiver element 1909 can comprise a second upper thermal sensor 1922 and a second lower thermal sensor 1932. The solar system 1900 further comprises a control system 1950 and motor 1960, the control system 1950 coupled to the motor 1960 and the sensors 1920, 1922, 1930, 1932 via wire 1952 in configurations described in greater detail below. The control system 1950 can be adapted to receive and process information and to adjust the position of the solar system 1900 via operation of the motor 1960 enabled through connection 1954 with the motor 1960.

In the illustrated embodiment, the receiver elements comprising the sensor pairs are those nearest the torque tube 1902. In other embodiments, they can be further spaced out. For example, in certain embodiments, the receiver elements can be the second pair spaced outward from the torque tube 1902. Preferably, however, the receiver elements containing paired thermal sensors are each the same number of reflector element mounting positions distant from the torque tube 1902. Thus, the first receiver element on the right would not be paired with a receiver element on the left which is mounted to the second reflector element, as counted outward from the torque tube 1902.

Figure 21:
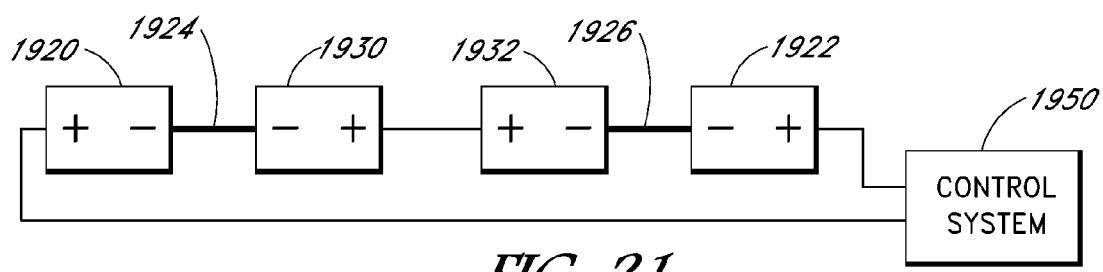
FIG. 21 is a schematic representation of another embodiment of a thermal tracking system.

With additional reference to FIG. 21, the sensors 1920, 1922, 1930, 1932 are shown in a schematic arrangement using conventions similar to those shown in FIG. 17. Because receiver element 1908 is mounted on the opposite side from the torque tube as receiver element 1909, the voltage output as a function of relative pointing error to the sun is also of opposite sign if, the first upper sensor 1920 is connected in reverse polarity to the first lower sensor 1930, and the second upper sensor 1922 is connected in reverse polarity to the second lower sensor 1932. As with other embodiments, any or all of the sensors 1920, 1922, 1930, 1932 can be directly connected to the control system 1950. Similarly, certain portions 1924, 1926 of the arrangement representing portions disposed along a photovoltaic laminate or anticipated sunlit portion of the receiver element can be composed of a material with little resistivity variation over a temperature range, as described above.

The arrangement shown in solar system 1900 permits correction of solar system 1900 misalignment by receiving information from the sensors 1920, 1922, 1930, 1932. In the illustrated orientation, where sunlight 1970 is received from above, the solar system 1900 is positioned at or near its horizontal position. If misalignment is present as a thermal gradient in the first receiver element 1908, it will also be present in the second receiver element 1909 as a thermal gradient however with an opposite sign convention if the uppermost sensor is considered the positive terminal. The thermal gradients, however, as present in the circuit arrangement shown in FIG. 20, will produce a voltage which the control system 1950 can receive and act upon to reduce the misalignment.

If, for example, the solar system 1900 is misaligned to a clockwise orientation from the horizontal, as shown in FIG. 20, the thermal gradient in the first receiver element 1908 would manifest with a relatively higher temperature sensed by the first upper sensor 1920 and a relatively lower temperature sensed by the first lower sensor 1930, producing a temperature difference. A corresponding reverse temperature difference would be sensed in the second receiver element 1909. The temperature sensed by the second upper sensor 1922 would also be relatively lower than the temperature sensed by the second lower sensor 1932. Because the sensors are wired in reverse polarity, however, the combined output voltage is double that of a single sensor thus increasing the sensitivity to tracking error as compared to the sensor connection technique shown in the embodiment of FIG. 17.

The control system 1950, receiving the resultant voltage produced by the circuit or producing an equivalent measure by evaluating a signal from each individual sensor, can operate the motor 1960 in response. The operation of the motor 1960 by the control system 1950 can thus be in response to information from the sensors 1920, 1922, 1930, 1932 and can reduce the misalignment. In this configuration, the voltage produced by both sensor pairs is additive in a positive voltage amount. In response to the positive voltage amount, the control system 1950 can adjust the position of the solar system 1900 via the motor 1960 counterclockwise, reducing misalignment.

If the solar system 1900 were misaligned by the same degree in the counterclockwise direction, a negative voltage of the same magnitude would be produced in the circuit arrangement contemplated, and the control system 1950 can be configured or adapted to operate the motor 1960 in response, but in a clockwise direction, again reducing misalignment. It will be appreciated by one of skill in the art that the magnitude of voltage error produced by a circuit arrangement shown in FIG. 20 is in fact double the voltage produced by a thermal gradient in either receiver element 1908, 1909, caused by the serial connection of the sensors 1920, 1922, 1930, 1932. Accordingly, relative to other embodiments, the control system 1950 can be adapted to adjust the position of the solar system 1900 by half the amount per unit voltage of sensed thermal gradient.

In addition to the operation described, the symmetric nature of the receiver elements 1908, 1909 permits them to provide information to the control system 1950 regarding air flow-related thermal gradients as well. When the solar system 1900 is positioned in an orientation similar to the horizontal one illustrated in FIG. 19, air flow is generally obstructed from flowing left to right in the illustration by the reflector elements 1906, which form concentric single troughs across the wind path. Air flow in a transverse direction down a trough does not create a second-type thermal gradient in the receiver elements because the heat spreading elements have open ends in a direction perpendicular to that air flow direction. Accordingly, the air flow is along the first open side and second open side, rather than through the heat spreader elements from the first to second open sides. In this configuration, no second-type thermal gradient is likely to occur in the receiver elements.

When the solar system 1900 is oriented via rotation around the torque tube 1902 in a greater direction to clockwise or counterclockwise, air flow along the trough elements, as described above, remains unlikely to produce a second-type thermal gradient. In such an orientation, however, air flow can pass from the upper side of a receiver element, across the face of a receiver element and toward the lower side of the receiver element, creating air flow through the heat spreader and shown in FIG. 16 above. Air can flow in either direction, whether from upper side to lower or the reverse. In either case, the air flow can cause the second-type thermal gradient, affecting misalignment reduction via thermal tracking.

In an arrangement such as that of the embodiment shown in FIGS. 19-21, however, the symmetry of the sensors 1920, 1922, 1930, 1932 and serial connection with reverse polarity between internal receiver element sensors produces a signal to the control system 1950 which accounts for both the first- and second-type thermal gradients. Air flow along the first receiver element 1908 is substantially similar to air flow along the second receiver element 1909, both in magnitude and direction (i.e., from upper side of the receiver element to the lower side or from lower side of the receiver element to the upper side). Additionally, when a solar system is rotated to a near vertical orientation and a field wind impinges on the system, the field wind forces air to flow in the same direction and speed through the receiver elements 1908 and 1909. In such circumstances, no adjustments to the tracking error signal are required. Similarly, for the embodiment shown in FIG. 20, the tracking error signal must only be adjusted when the air flow is significantly different between the two receiver elements. Thus, with a single connection to the control system 1950, the four thermal sensors 1920, 1922, 1930, 1932 can correct misalignment of the solar system 1900.

Figure 22:
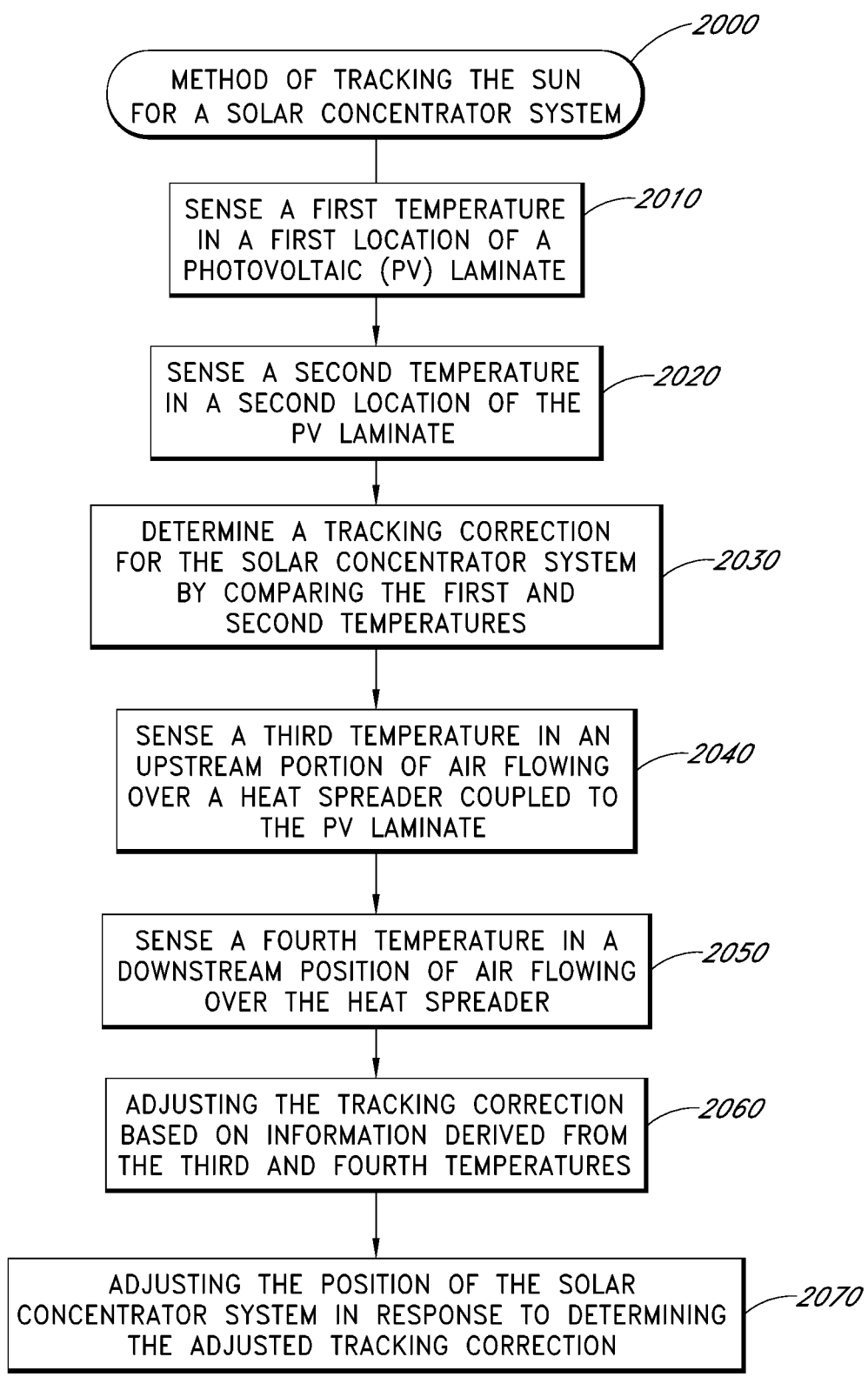
FIG. 22 is a flowchart diagram of another method of controlling the position of a solar system.

FIG. 22 is a flowchart diagram of another technique 2000 for tracking the sun with a solar concentrator system. First, thermal sensors can be used to detect first 2010 and second 2020 temperatures at first and second locations in a photovoltaic (PV) laminate of the solar concentrator system. As described above, in certain embodiments, other sensors can be used besides thermal sensors. Some alternatives include thermal intensity sensors, such as photosensors, whether sensitive in the visible spectrum of the EM band, or detecting UV light, or other EM emissions.

It is then possible to determine a tracking correction 2030 for the solar concentrator system, the tracking correction used for reducing misalignment during positioning of the solar concentrator system. Additionally, sensors can sense a third 2040 and fourth 2050 temperature in an upstream location and downstream location, respectively, of air flowing over a heat spreader coupled to the PV laminate. From the information received by sensing the third and fourth temperatures, it is possible to adjust 2060 the tracking correction to more accurately reduce any misalignment of the solar concentrator system. Finally, the position of the solar concentrator system can be adjusted 2070 using and in response to determining the adjusted tracking correction. This step, including any comparisons, calculations, or determinations, can be performed by a computing device, such as a system controller. Operation of a motor or drive unit that adjusts the position of the solar concentrator system can also be accomplished by the system controller.

Figure 23:
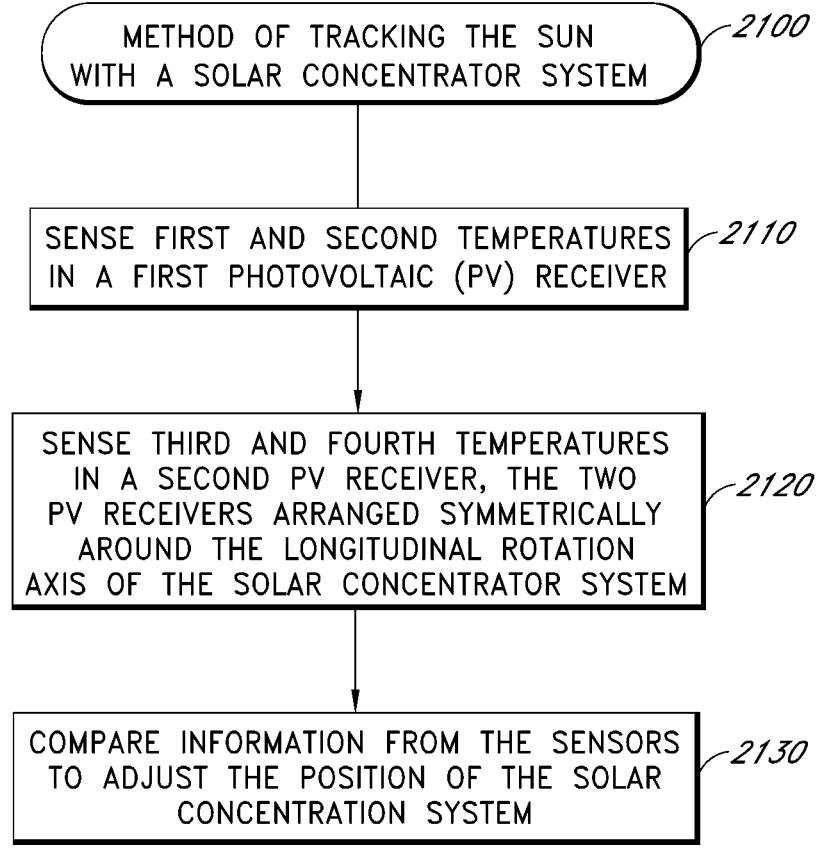
FIG. 23 is a flowchart diagram of yet another method of controlling the position of a solar system.

FIG. 23 illustrates another technique 2100 for tracking the sun with a solar concentrator system. Thermal sensors can sense first and second temperatures 2110 in a single PV receiver, such as in a PV laminate. As described above, temperatures are merely one type of sensor that can be used. In a second receiver positioned symmetrically across the torque tube of a solar concentrator system from the first PV receiver, third and fourth sensors can sense third and fourth temperatures 2120 in the PV receiver. For all temperatures, the temperature can be sensed in any of several positions within the solar receiver, such as any of those illustrated and described with reference to FIG. 5-9, 15, 16, or 19, or any of the embodiments described herein. The sensor information can then be compared 2130, such as shown and described with reference to FIGS. 19-21. This information can determine tracking information which a system controller can use to adjust the position of the solar concentrator system to reduce misalignment, thereby improving the performance of the solar concentrator system.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A thermal tracking system for a concentrating photovoltaic system comprising:
   a photovoltaic receiver extending in a longitudinal direction, the photovoltaic receiver comprising:
      a photovoltaic laminate having first and second edges extending parallel to the longitudinal direction, the photovoltaic receiver having a front side with a front surface, the front side directed to receive sunlight and a back side with a back surface, the back side opposite the front side, the photovoltaic laminate comprising a plurality of photovoltaic solar cells;
      a heat spreader coupled to the back side of the photovoltaic laminate along the longitudinal direction and extending toward the first and second edges of the photovoltaic laminate, the heat spreader stopping short of the first edge and the second edge;
      first and second thermal sensors coupled to and in direct contact with the back side of the photovoltaic laminate and disposed between the back side of the photovoltaic laminate and the heat spreader, the first thermal sensor closer to the first edge than the second edge, the second thermal sensor closer to the second edge than the first edge, the first and second thermal sensors adapted to sense a temperature of the photovoltaic laminate; and third and fourth thermal sensors coupled to the back surface of the photovoltaic laminate and adjacent the heat spreader, the third thermal sensor positioned between the first edge and the heat spreader, the fourth thermal sensor positioned between the second edge and the heat spreader.

2. The thermal tracking system of claim 1, wherein the first and second thermal sensors are electrically connected.

3. The thermal tracking system of claim 2, wherein the third and fourth thermal sensors are electrically connected.

4. The thermal tracking system of claim 3, wherein the first and second thermal sensors are electrically connected to the third and fourth thermal sensors.

5. The thermal tracking system of claim 4, wherein each of the first, second, third, and fourth thermal sensors are connected in series.

6. The thermal tracking system of claim 1, wherein the third and fourth thermal sensors are spaced apart from the back surface of the photovoltaic laminate.

7. The thermal tracking system of claim 6, wherein the third and fourth thermal sensors are each positioned atop an offset member positioning them apart from the photovoltaic laminate.

8. The thermal tracking system of claim 1, wherein the first thermal sensor is connected in reverse polarity to the second thermal sensor.

9. The thermal tracking system of claim 8, wherein the third thermal sensor is connected in reverse polarity to the fourth thermal sensor.

10. The thermal tracking system of claim 1, additionally comprising a concentrator configured to direct concentrated sunlight onto the front side of the photovoltaic laminate.

11. A method for tracking the sun for a concentrated photovoltaic system, the concentrated photovoltaic system comprising a photovoltaic receiver extending in a longitudinal direction and a heat spreader coupled to a back side of the photovoltaic laminate along the longitudinal direction, the method comprising:
sensing a first temperature in a first location of the photovoltaic laminate with a first thermal sensor, the first thermal sensor coupled to and in direct contact with the back side of the photovoltaic laminate and disposed between the back side of the photovoltaic laminate and the heat spreader, the photovoltaic laminate having first and second edges extending parallel to the longitudinal direction, the photovoltaic receiver having a front side with a front surface and the back side with a back surface, the front side directed to receive sunlight, the back side opposite the front side, the photovoltaic laminate comprising a plurality of photovoltaic solar cells, the heat spreader extending toward the first and second edges of the photovoltaic laminate, the heat spreader stopping short of the first edge and the second edge, the first thermal sensor closer to the first edge than the second edge;
sensing a second temperature in a second location of the photovoltaic laminate with a second thermal sensor, the second thermal sensor coupled to and in direct contact with the back side of the photovoltaic laminate and disposed between the back side of the photovoltaic laminate and the heat spreader, the second thermal sensor closer to the second edge than the first edge;
determining a tracking correction for the concentrated photovoltaic system by comparing the first and second temperatures;
sensing a third temperature in an upstream position of air flowing over the heat spreader with a third thermal sensor positioned on the back surface of the photovoltaic laminate and adjacent the heat spreader, the third thermal sensor positioned between the first edge and the heat spreader;
sensing a fourth temperature in a downstream position of air flowing over the heat spreader with a fourth thermal sensor positioned on the back surface of the photovoltaic laminate and adjacent the heat spreader, the fourth thermal sensor positioned between the second edge and the heat spreader; and
adjusting the tracking correction for the concentrated photovoltaic system based on information derived from the third and fourth temperatures.

12. The method of claim 11, wherein comparing the first and second temperatures comprises subtracting a value for the first temperature from a value for the second temperature.

13. The method of claim 11, wherein sensing the third temperature comprises sensing a temperature with the third sensor and sensing the fourth temperature comprises sensing a temperature with the fourth sensor.

14. The method of claim 11, wherein adjusting the tracking correction based on information derived from the third and fourth temperatures comprises electrically connecting the third sensor and the fourth sensor.

15. The method of claim 14, wherein electrically connecting the third and fourth sensors comprises connecting the third and fourth sensors in reverse polarity.

16. The method of claim 11, wherein adjusting the tracking correction for the concentrated photovoltaic system based on information derived from the third and fourth temperatures comprises adjusting the tracking correction based on cooling of the photovoltaic laminate to improve the estimation of a temperature gradient in the photovoltaic laminate caused by imprecision in positioning of concentrated sunlight on the photovoltaic receiver.

17. The method of claim 11, wherein sensing the first and second temperatures in the first and second locations of the photovoltaic laminate comprises positioning first and second thermocouples against the photovoltaic laminate.

18. The method of claim 11, further comprising adjusting the position of the concentrating photovoltaic system in response to the adjusted tracking correction.

19. A concentrating photovoltaic system comprising:
a reflective surface adapted to concentrate sunlight to produce focused sunlight;
a photovoltaic receiver extending in a longitudinal direction and positioned to receive the focused sunlight, the photovoltaic receiver comprising a photovoltaic laminate having first and second edges extending parallel to the longitudinal direction, the photovoltaic receiver having a front side with a front surface, the front side directed to receive sunlight and a back side with a back surface, the back side opposite the front side, the photovoltaic laminate comprising photovoltaic solar cells;
first and second thermal sensors directly contacting the back side of the photovoltaic laminate in the concentrating photovoltaic system;
a heat spreader in thermal communication with the back side of the photovoltaic laminate, the heat spreader having a first open side and a second open side, wherein the first and second thermal sensors are disposed between the heat spreader and the back side of the photovoltaic laminate;

third and fourth thermal sensors, the third thermal sensor positioned near the first open side of the heat spreader between the first open side and the first edge and the fourth thermal sensor positioned near the second open side of the heat spreader between the second open side and the second edge;

a motor adapted to adjust the position of the concentrating photovoltaic system; and a control system adapted to operate the motor, the control system connected to and receiving information from the first, second, third, and fourth thermal sensors, the control system further adapted to operate the motor in response to a signal received from at least one of the first, second, third, and fourth thermal sensors.

20. The concentrating photovoltaic system of claim 19, wherein the control system is further adapted to compare information from the first and second thermal sensors to determine a correction value for the position of the concentrating photovoltaic system.

21. The concentrating photovoltaic system of claim 20, wherein the control system is further adapted to adjust the correction value in response to information received from the third and fourth thermal sensors.

22. The concentrating photovoltaic system of claim 21, wherein each of the first, second, third, and fourth thermal sensors are electrically connected to one another.

23. The concentrating photovoltaic system of claim 22, wherein the second thermal sensor is connected in reverse polarity to the first thermal sensor.

24. The concentrating photovoltaic system of claim 23, wherein the fourth thermal sensor is connected in reverse polarity to the third thermal sensor.

25. The concentrating photovoltaic system of claim 19, wherein the photovoltaic solar cells are back-contact solar cells.

* * * * *